United States Patent
Hsiao

(10) Patent No.: US 10,614,892 B1
(45) Date of Patent: Apr. 7, 2020

(54) DATA READING METHOD, STORAGE CONTROLLER AND STORAGE DEVICE

(71) Applicant: Shenzhen EpoStar Electronics Limited CO., Shenzhen (CN)

(72) Inventor: Yu-Hua Hsiao, Hsinchu County (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 0 days.

(21) Appl. No.: 16/354,204

(22) Filed: Mar. 15, 2019

(30) Foreign Application Priority Data

Jan. 19, 2019 (TW) .............................. 108102147 A

(51) Int. Cl.
| | |
|---|---|
| G11C 16/06 | (2006.01) |
| G11C 16/26 | (2006.01) |
| G06F 11/30 | (2006.01) |
| G11C 16/08 | (2006.01) |

(52) U.S. Cl.
CPC .......... *G11C 16/26* (2013.01); *G06F 11/3037* (2013.01); *G11C 16/08* (2013.01)

(58) Field of Classification Search
CPC . G11C 11/5642; G11C 16/26; G11C 16/0483; G11C 11/5671; G11C 16/10; G11C 16/3495; G11C 29/021; G11C 29/028; G11C 29/52; G11C 11/4087; G11C 11/5628; G11C 16/08
USPC ............ 365/185.18, 185.03, 185.17, 185.24, 365/185.09, 185.27, 185.22, 185.2, 365/185.21, 185.25, 189.05, 189.09
See application file for complete search history.

(56) References Cited

U.S. PATENT DOCUMENTS

| | | | |
|---|---|---|---|
| 10,521,291 B2* | 12/2019 | Ha ..................... | H03M 13/3707 |
| 2017/0271031 A1 | 9/2017 | Sharon et al. | |
| 2018/0059936 A1 | 3/2018 | Harada | |
| 2018/0204624 A1 | 7/2018 | Yoon et al. | |

FOREIGN PATENT DOCUMENTS

| | | |
|---|---|---|
| CN | 102543197 B | 7/2015 |
| CN | 107204204 | 9/2017 |
| CN | 108305660 | 7/2018 |
| TW | I640008 B | 11/2018 |

OTHER PUBLICATIONS

"Office Action of Taiwan Counterpart Application", dated Aug. 16, 2019, p. 1-p. 3.

* cited by examiner

*Primary Examiner* — Thong Q Le
(74) *Attorney, Agent, or Firm* — JCIPRNET

(57) ABSTRACT

A data reading method is provided. The method includes updating a target optimized count value corresponding to a target physical page, in response to determining that a read voltage optimization operation needs to be performed to the target physical page among a plurality of physical pages according to a plurality of monitor results corresponding to the physical pages of the target wordline; performing a first type read voltage optimization operation, a second type read voltage optimization operation, or a third type read voltage optimization operation corresponding to the target wordline according to the target optimized count value, so as to obtain an optimized read voltage set corresponding to the target wordline, wherein the target wordline is read by using the optimized read voltage set.

13 Claims, 9 Drawing Sheets

DATA READING METHOD, STORAGE CONTROLLER AND STORAGE DEVICE

CROSS-REFERENCE TO RELATED APPLICATION

This application claims the priority benefit of Taiwan application serial no. 108102147, filed on Jan. 19, 2019. The entirety of the above-mentioned patent application is hereby incorporated by reference herein and made a part of this specification.

BACKGROUND OF THE DISCLOSURE

Field of the Disclosure

The disclosure relates to a data reading method, and more particularly to a data reading method, a storage controller and a storage device adapted for a storage device configured with a rewritable non-volatile memory module.

Description of Related Art

Generally, when reading data in a rewritable non-volatile memory module, if the read failure does not occur, the system uses a preset read voltage set or a previously used optimized read voltage set to read the data. When the read failure occurs, the system (storage system) does not use the preset read voltage set or the previously used optimized voltage, and correspondingly adjusts the read voltage set to try to find an optimized read voltage set, thereby successfully reading the correct data by using the optimized read voltage.

However, the conventional method of adjusting the read voltage set to obtain the optimized read voltage set to read data is mostly to perform a read voltage optimization operation (also referred to as wordline level read voltage optimization operation) to a read voltage set corresponding to a target wordline, thereby performing the read voltage optimization operation to all the physical pages of the target wordline. That is, the conventional method ignores that the read failure might not be caused by all the physical pages of the target wordline but caused by a specific physical page of the target wordline with a poor reading status (e.g., a target physical page with more error bit numbers).

Since the conventional method is not capable of performing the page level read voltage optimization operation only to the transition read voltage for identifying the specific physical page only for the specific physical page of the target wordline with poor reading condition, when the reading condition of a specific physical page of the plurality of physical pages of the target wordline is poor, the conventional method requires a relatively large amount of resource to perform the read voltage optimization operation for the entire target wordline, in order to obtain the optimized read voltage of the transition read voltage corresponding to a specific physical page to improve the reading status of the specific physical page. As a result, the efficiency of reading data is reduced.

On the other hand, when it is determined that a specific physical page of the target wordline needs to be subjected to a read voltage optimization operation due to a poor reading condition, the current conventional practice does not take into consideration or anticipate whether other physical pages also need to be subjected to the read voltage optimization operation at the current timing. That is to say, the current conventional method needs to wait to perform the read voltage optimization operation to the specific physical page or wordline only when the poor reading condition occurs to the specific physical page of a plurality physical pages of the wordline. As a result, since the conventional method performs the read voltage optimization operation only when discovering that the reading condition of the specific physical page is poor during the execution of the data reading operation, the conventional practice is likely to cause delay of data reading operation and decrease the overall efficiency of the storage device.

Therefore, it is an issue for practitioners of the field to explore how to determine and predict the timing for performing the wordline level read voltage optimization operation and the timing for performing the page level read voltage optimization operation, and to quickly and efficiently perform optimization to the transition read voltage for identifying the storage status of the specific physical page without preparing the authentication data, thereby improving the defect of conventional practice and improving the data reading efficiency of the rewritable non-volatile memory module while reducing the load of decode operation.

SUMMARY OF THE DISCLOSURE

The disclosure provides a data reading method, a storage controller and a storage device, which are capable of determining and predicting a timing for performing a wordline level read voltage optimization operation and a timing for performing a page level read voltage optimization operation to quickly and efficiently obtain the precise page level optimized read voltage set without preparing the authentication data, such that the data of the corresponding physical page is correctly read through the optimized read voltage set, thereby improving the efficiency of the data reading operation.

An embodiment of the disclosure provides a data reading method adapted for a storage device configured with a rewritable non-volatile memory module. The rewritable non-volatile memory module has a plurality of wordlines, wherein each of the plurality of wordlines is coupled to a plurality of memory cells, wherein each of the plurality of memory cells includes a plurality of physical pages, and each of the plurality of physical pages is configured to be programmed into a bit value. The method includes selecting one of the plurality of wordlines as a target wordline, and monitoring a plurality of physical pages of the selected target wordline to obtain a plurality of monitoring results respectively corresponding to the plurality of physical pages of the target wordline; updating a target optimized count value corresponding to the target physical page in response to determining that the read voltage optimization operation needs to be performed to one target physical page of the plurality of physical pages of the target wordline according to the plurality of monitoring results; and performing a first type read voltage optimization operation, a second type read voltage optimization operation or a third type read voltage optimization operation corresponding to the target wordline according to the target optimized count value to obtain an optimized read voltage set corresponding to the target wordline, wherein the target wordline is read by using the optimized read voltage set.

An embodiment of the disclosure provides a storage controller for controlling a storage device configured with a rewritable non-volatile memory module. The storage controller includes a connection interface circuit, a memory interface control circuit, a read voltage management circuit unit, and a processor. The connection interface circuit is coupled to a host system. The memory interface control circuit is coupled to the rewritable non-volatile memory module, wherein the rewritable non-volatile memory module has a plurality of wordlines, wherein each of the plurality of wordlines is coupled to a plurality of memory cells, wherein each of the plurality of memory cells includes a plurality of physical pages, and each of the plurality of physical pages is configured to be programmed into a bit value. The processor is coupled to the connection interface circuit, the memory interface control circuit, and the read voltage management circuit unit. The processor is configured to select one of the plurality of wordlines as a target wordline, and monitor a plurality of physical pages of the selected target wordline to obtain a plurality of monitoring results respectively corresponding to the plurality of physical pages of the target wordline. In response to being determined by the processor that the read voltage optimization operation needs to be performed to one target physical page of the plurality of physical pages of the target wordline according to the plurality of monitoring results, the read voltage management circuit unit is configured to update a target optimized count value corresponding to the target physical page, wherein the read voltage management circuit unit is further configured to perform a first type read voltage optimization operation, a second type read voltage optimization operation or a third type read voltage optimization operation corresponding to the target wordline according to the target optimization count value, thereby obtaining the optimized read voltage set corresponding to the target wordline, wherein the target wordline is read by using the optimized read voltage set.

An embodiment of the disclosure provides a storage device. The storage device includes a rewritable non-volatile memory module, a memory interface control circuit, and a processor. The rewritable non-volatile memory module has a plurality of wordlines, wherein each of the wordlines is coupled to a plurality of memory cells, wherein each of the plurality of memory cells includes a plurality of physical pages, and each of the plurality of physical pages is configured to be programmed into a bit value. The memory interface control circuit is coupled to the rewritable non-volatile memory module. The processor is coupled to the memory interface control circuit. The processor loads and executes a read voltage management program code module to implement a data reading method. The data reading method includes the steps of: selecting one of the plurality of wordlines as a target wordline, and monitoring a plurality of physical pages of the selected target wordline to obtain a plurality of monitoring results respectively corresponding to the plurality of physical pages of the target wordline; updating a target optimized count value corresponding to the target physical page in response to determining that the read voltage optimization operation needs to be performed to one target physical page of the plurality of physical pages of the target wordline according to the plurality of monitoring results; and performing a first type read voltage optimization operation, a second type read voltage optimization operation or a third type read voltage optimization operation corresponding to the target wordline according to the target optimized count value to obtain an optimized read voltage set corresponding to the target wordline, wherein the target wordline is read by using the optimized read voltage set.

Based on the above, the data reading method, the storage controller, and the storage device provided by the embodiments of the disclosure are capable of updating target optimized count value corresponding to the target physical page in response to determining that the read voltage optimization operation needs to be performed to one target physical page of the plurality of physical pages of the target wordline, and determining whether to perform the read voltage optimization operation to other physical pages or the entire target wordline according to the target optimized count value; and using the obtained optimized read voltage set corresponding to the target wordline to read the target wordline after the read voltage optimization operation is completed. In this way, the correctness of the data read from the target wordline can be improved, and the overall efficiency of the data reading operation of the storage device can be enhanced.

In order to make the aforementioned features and advantages of the disclosure more comprehensible, embodiments accompanying figures are described in detail below.

DESCRIPTION OF EMBODIMENTS

In the embodiment, a storage device includes a rewritable non-volatile memory module and a storage device controller (a.k.a. a storage controller or a storage control circuit). Also, the storage device is usually used together with a host system so the host system can write data into or read data from the storage device.

Figure 1:
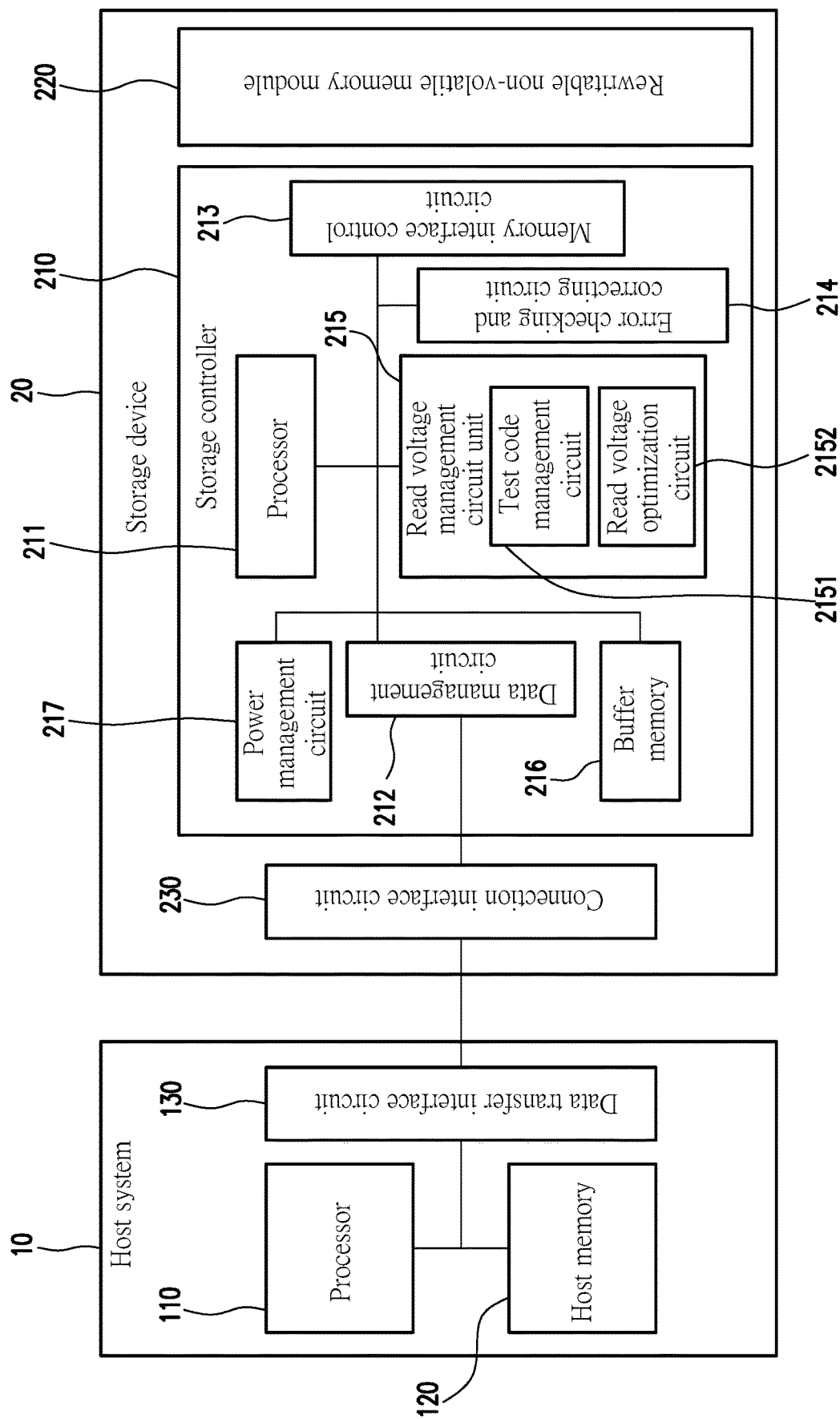
FIG. 1 is a block diagram illustrating a host system and a storage device according to an embodiment of the disclosure.

FIG. 1 is a block diagram illustrating a host system and a storage device according to an embodiment of the disclosure.

With reference to FIG. 1, a host system 10 includes a processor 110, a host memory 120 and a data transfer interface circuit 130. In this embodiment, the data transfer interface circuit 130 is coupled to (or, electrically connected to) the processor 110 and the host memory 120. In another embodiment, the processor 110, the host memory 120 and the data transfer interface circuit 130 are coupled to one another by utilizing a system bus.

A storage device 20 includes a storage controller 210, a rewritable non-volatile memory module 220 and a connection interface circuit 230. Among them, the storage controller 210 includes a processor 211, a data management circuit 212 and a memory interface control circuit 213.

In this embodiment, the host system 10 is coupled to the storage device 20 through the data transfer interface circuit 130 and the connection interface circuit 230 of the storage device 20 to perform a data accessing operation. For example, the host system 10 can store data to the storage device 20 or read data from the storage device 20 through the data transfer interface circuit 130.

In the embodiment, the processor 110, the host memory 120 and the data transfer interface circuit 130 may be disposed on a main board of the host system 10. The number of the data transfer interface circuit 130 may be one or more. Through the data transfer interface circuit 130, the main board may be coupled to the storage device 20 in a wired manner or a wireless manner. The storage device 20 may be, for example, a flash drive, a memory card, a solid state drive (SSD) or a wireless memory storage device. The wireless memory storage device may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board may also be coupled to various I/O devices including a GPS (Global Positioning System) module, a network interface card, a wireless transmission device, a keyboard, a monitor and a speaker through the system bus.

In this embodiment, the data transfer interface circuit 130 and the connection interface circuit 230 are an interface circuit compatible with a Peripheral Component Interconnect Express (PCI Express) interface standard. Further, a data transfer is performed between the data transfer interface circuit 130 and the connection interface circuit 230 by using a communication protocol of a Non-Volatile Memory express (NVMe) interface standard.

Nevertheless, it should be understood that the disclosure is not limited to the above. The data transfer interface circuit 130 and the connection interface circuit 230 may also be compatible to a PATA (Parallel Advanced Technology Attachment) standard, an IEEE (Institute of Electrical and Electronic Engineers) 1394 standard, a Serial Advanced Technology Attachment (SATA) standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC interface standard, a UFS (Universal Flash Storage) interface standard, an eMCP interface standard, a CF interface standard, an IDE (Integrated Device Electronics) interface standard or other suitable standards. Further, in another embodiment, the connection interface circuit 230 and the storage controller 210 may be packaged into one chip, or the connection interface circuit 230 is distributed outside a chip containing the storage controller 210.

In this embodiment, the host memory 120 is configured to temporarily store commands executed by the processor 110 or data. For instance, in this exemplary embodiment, the host memory 120 may be a DRAM (Dynamic Random Access Memory), or a SRAM (Static Random Access Memory) and the like. Nevertheless, it should be understood that the disclosure is not limited thereto, and the host memory 120 may also be other appropriate memories.

The storage unit 210 is configured to execute a plurality of logic gates or control commands, which are implemented in a hardware form or in a firmware form, and to perform operations of writing, reading or erasing data in the rewritable non-volatile memory storage module 220 according to the commands of the host system 10.

More specifically, the processor 211 in the storage controller 210 is a hardware with computing capabilities, which is configured to control overall operation of the storage controller 210. Specifically, the processor 211 has a plurality of control commands and the control commands are executed to perform various operations such as writing, reading and erasing data during operation of the storage device 20.

It should be noted that, in the embodiment, the processor 110 and the processor 211 are, for example, a central processing unit (CPU), a micro-processor, other programmable microprocessors, a digital signal processor (DSP), a programmable controller, an application specific integrated circuits (ASIC), a programmable logic device (PLD) or other similar circuit elements. The disclosure is not limited thereto.

In an embodiment, the storage controller 210 further includes a ROM (not illustrated) and a RAM (not illustrated). More particularly, the ROM has a boot code, which is executed by the processor 211 to load the control commands stored in the rewritable non-volatile memory module 220 into the RAM of the storage controller 210 when the storage controller 210 is enabled. Then, the control commands are executed by the processor 211 to perform operations, such as writing, reading or erasing data. In another embodiment, the control commands of the processor 211 may also be stored as program codes in a specific area, for example, physical storage units in the rewritable non-volatile memory module 220 dedicated for storing system data of the rewritable non-volatile memory module 220.

In this embodiment, as described above, the storage controller 210 further includes the data management circuit 212 and the memory interface control circuit 213. It should be noted that, operations performed by each part of the storage controller 210 may also be considered as operations performed by the storage controller 210.

The data management circuit 212 is coupled to the processor 211, the memory interface control circuit 213 and the connection interface circuit 230. The data management circuit 212 is configured to transmit data under instruction of the processor 211. For example, the data may be read from the host system 10 (e.g., the host memory 120) through the connection interface circuit 230, and the read data may be written into the rewritable non-volatile memory module 220 through the memory interface control circuit 213 (e.g., a writing operation performed according to the write command from the host system 10). As another example, the data may be read from one or more physical units of the rewritable non-volatile memory module 220 through the memory interface control circuit 213 (the data may be read from one or more memory cells in one or more physical units), and the read data may be written into the host system 10 (e.g., the host memory 120) through the connection interface circuit 230 (e.g., a reading operation performed according to a read command from the host system 10). In another embodiment, the data management circuit 212 may also be integrated into the processor 211.

The memory interface control circuit 213 is configured to perform the writing (or, programming) operation, the reading operation and the erasing operation for the rewritable non-volatile memory module 220 together with the data management circuit 212 under instruction of the processor 211.

For instance, the processor 211 may execute a write command sequence to instruct the memory interface control circuit 213 to write the data into the rewritable non-volatile memory module 220; the processor 211 can execute a read command sequence to instruct the memory interface control circuit 213 to read the data from one or more physical units corresponding to the read command in the rewritable non-volatile memory module 220; the processor 211 can execute an erase command sequence to instruct the memory interface control circuit 213 to perform the erasing operation for the rewritable non-volatile memory module 220. Each of the write command sequence, the read command sequence and the erase command sequence may include one or more program codes or command codes, which are configured to perform the corresponding writing, reading and erasing operations on the rewritable non-volatile memory module 220. In an embodiment, the processor 211 may further send other types of command sequences to the memory interface control circuit 213 so as to perform corresponding operations on the rewritable non-volatile memory module 220.

In addition, data to be written to the rewritable non-volatile memory module 220 is converted into a format acceptable by the rewritable non-volatile memory module 220 through the memory interface control circuit 213. Specifically, if the processor 211 executes the write or read command to access the rewritable non-volatile memory module 220, the processor 211 transmits a corresponding command sequence to the memory interface control circuit 213 to instruct the memory interface control circuit 213 to perform a corresponding operation. For example, the command sequences may include a write command sequence instructing to write data, a read command sequence instructing to read data, an erase command sequence instructing to erase data and corresponding command sequences instructing to perform various memory operations (e.g., changing a plurality of preset read voltage values of the preset reading voltage set to perform reading operation, or performing garbage collecting operation and so on). The command sequences may include one or more signals, or data from the bus. The signals or the data may include command codes and program codes. For example, information such as identification codes and memory addresses are included in the read command sequence.

The rewritable non-volatile memory module 220 is coupled to the storage controller 210 (the memory control circuit unit 213) and configured to store data written from the host system 10. The rewritable non-volatile memory module 220 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quadruple Level Cell) NAND flash memory module (i.e., a flash memory module capable of storing four bits in one memory cell), a 3D NAND flash memory module or a vertical NAND flash memory module and the like or any memory module having the same features. The memory cells in the rewritable non-volatile memory module 220 are disposed in an array.

In this embodiment, the rewritable non-volatile memory module 220 has a plurality of wordlines, wherein each of the plurality of wordlines is coupled to a plurality of memory cells. The memory cells on the same wordline constitute one or more physical programming units. In addition, a plurality of physical programming units may constitute one physical unit (a physical block or a physical erasing unit). In the embodiment, the triple level cell (TLC) NAND flash memory module is described as an example. That is, in the following embodiment, the memory cell capable of storing three bit values serves as a physical programming unit (that is, in each programming operation, the programming voltage is applied to one physical programming unit after another to program data), wherein each memory includes a lower physical page, a middle physical page and an upper physical page capable of storing one bit value respectively.

In this embodiment, the memory cell is used as a minimum unit for writing (programming) data. The physical unit is the minimum unit for erasing data. That is, each physical unit contains a minimum number of memory cell that is erased.

The storage controller 210 assigns a plurality of logical units for the rewritable non-volatile memory module 220. The host system 10 accesses user data stored in a plurality of physical units through the assigned logical units. Here, each of the logical units may be composed of one or more logical addresses. For example, the logical unit may be a logical block, a logical page, or a logical sector. One logical unit may be mapped to one or more physical units, wherein the physical unit may be one or more physical addresses, one or more physical sectors, one or more physical programming units or one or more physical erasing units. In the embodiment, the logical unit is a logical block, and the logical sub-unit is a logical page. Each of the logical units has multiple logical sub-units.

Additionally, the storage controller 210 would create a logical-to-physical address mapping table and a physical-to-logical address mapping table for recording a mapping relation between the logical unit (e.g., logical blocks, logical pages, or logical sectors) assigned to the rewritable non-volatile memory module 220 and the physical units (e.g., physical erasing units, physical programming units, physical sectors). In other words, the storage controller 210 can look up for the physical unit mapped by one logical unit by using the logical-to-physical address mapping table, and the storage controller 210 can look up for the logical unit mapped by one physical unit by using the physical-to-logical address mapping table. Nonetheless, the technical concept for the mapping relation between the logical units and the physical units is a well-known technical means in the field, which is not repeated hereinafter.

In this embodiment, the error checking and correcting circuit 214 is coupled to the processor 211 and configured to execute an error checking and correcting procedure to ensure correctness of data. Specifically, when the processor 211 receives the write command from the host system 10, the error checking and correcting circuit 214 generates an ECC (error correcting code) and/or an EDC (error detecting code) for data corresponding to the write command, and the processor 211 writes data corresponding to the write command and the corresponding ECC and/or the EDC into the rewritable non-volatile memory module 220. Then, when the processor 211 reads the data from the rewritable non-volatile memory module 220, the ECC and/or the EDC corresponding to the data are also read, and the error checking and correcting circuit 214 performs the error checking and correcting procedure on the read data based on the ECC and/or the EDC.

For example, when performing data reading operation to a plurality of physical pages of one wordline and executing the corresponding error checking and correcting procedure, the error checking and correcting circuit 214 can obtain a plurality of syndromes corresponding to the plurality of physical pages. The error checking and correcting circuit 214 can return the plurality of syndromes respectively corresponding to the plurality to the physical pages to the processor 211. In addition, after the error checking and correcting procedure is completed, if the read data is successfully decoded, the error checking and correcting circuit 214 can obtain a plurality of error bit numbers respectively corresponding to the plurality of physical pages. The error checking and correcting circuit 214 can return the plurality of error bit numbers respectively corresponding to the plurality of physical pages to the processor 211.

In an embodiment, the storage controller 210 further includes a buffer memory 216 and a power management circuit 217. The buffer memory 216 is coupled to the processor 211 and configured to temporarily store data and commands from the host system 10, data from the rewritable non-volatile memory module 220 or other system data for managing the storage device 20 so the processor 211 can rapidly access the data, the command or the system data from the buffer memory 216. The power management circuit 217 is coupled to the processor 211 and configured to control power of the storage device 20.

In the embodiment, the read voltage management circuit unit 215 includes an optimization count circuit 2151 and a read voltage optimization circuit 2152. The read voltage management circuit unit 215 is configured to manage a plurality of read voltage sets corresponding to a plurality of wordlines.

It should be mentioned that, for convenience of description, the following embodiment is exemplified by using a TLC NAND flash memory module, but the data reading method provided in the embodiments of the disclosure may also be applied to other types of flash memory modules.

In this embodiment, the read voltage management circuit unit 215 can respectively perform the page level read voltage optimization operation to one or more specific physical pages of the specific wordline in the TLC NAND flash memory module according to the arrangement sequence of the lower physical page, the middle physical page and the upper physical page, thereby obtaining a plurality of optimized read voltages respectively corresponding to the one or more specific physical pages (e.g., one of the lower physical page, the middle physical page, and the upper physical page). In addition, the read voltage management circuit unit 215 can directly perform a wordline level read voltage optimization operation to the specific wordline to directly perform the read voltage optimization operation to all of the physical pages of the specific wordline in the TLC NAND flash memory module, thereby obtaining the optimized read voltage set (including a plurality of optimized read voltages respectively corresponding to the plurality of physical pages) corresponding to the specific wordline.

In this embodiment, if the read voltage optimization operation performed has been completed and an optimized read voltage set corresponding to the target wordline is obtained, the read voltage management circuit unit 215 may record the optimized read voltage set corresponding to the target wordline.

The data reading method, the storage controller and the storage device provided in the embodiments of the disclosure will be described in detail below with reference to a plurality of drawings, and it will be further described in details how the read voltage management circuit unit 215 performs a first type read voltage optimization operation, a second type read voltage optimization operation, or a third type read voltage optimization operation corresponding to the target wordline, and the operation flow and functions of the optimization count circuit 2151 and the read voltage optimization circuit 2152 are also described.

Figure 2A:
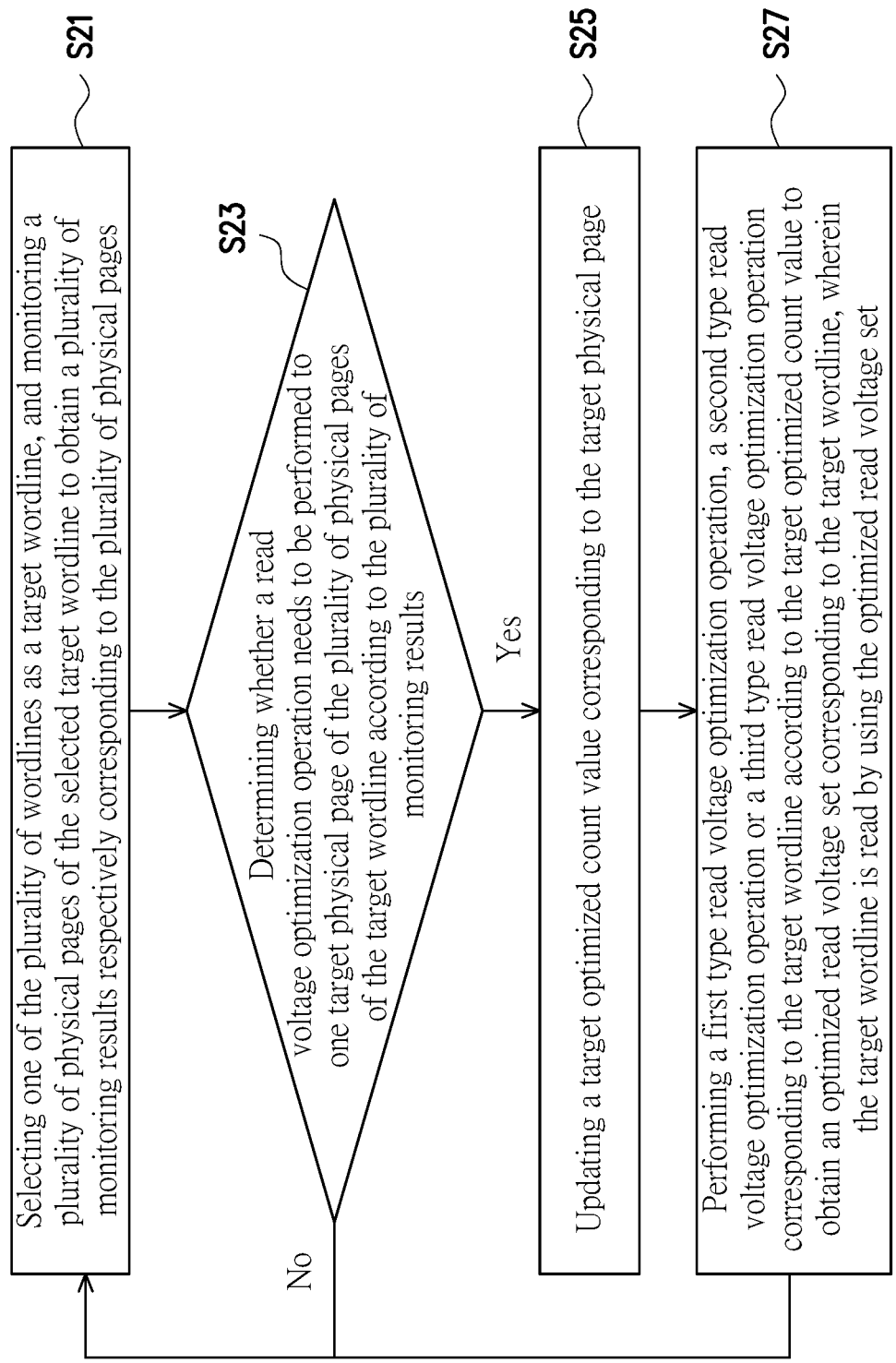
FIG. 2A is a flowchart of a data reading method according to an embodiment of the disclosure.

FIG. 2A is a flowchart of a data reading method according to an embodiment of the disclosure. Referring to FIG. 1 and FIG. 2A, in step S21, the processor 211 selects one of the plurality of wordlines as a target wordline, and monitors a plurality of physical pages of the selected target wordline to obtain a plurality of monitoring results respectively corresponding to the plurality of physical pages.

Specifically, the processor 211 can select one of a plurality of wordlines (also referred to as target wordline) belonging to the plurality of physical units of the rewritable non-volatile memory module 220 and a specific physical page (also referred to as target physical page) of the target wordline at a specific timing, and instruct the read voltage management circuit unit 215 to perform the read voltage optimization operation to the target physical page of the target wordline. For example, the processor 211 can select a target wordline from all the wordlines to perform the read voltage optimization operation when (1) the storage device 20 is idle (i.e., the storage device 20 is idle for more than a predetermined time threshold); (2) the storage device is powered on; or (3) the error bit number of the data read from one wordline exceeds an error bit number threshold. Specifically, the processor 211 can select a wordline with a poor physical state (for example, a wordline with a larger number of erasing counts, a larger number of reading counts, a longer retention time, or more error bit numbers) as the target wordline. It should be noted that a plurality of memory cells and a plurality of physical pages of the selected target wordline have stored data (data has been programmed).

In an embodiment, the processor 211 may also randomly select a target wordline, and select one of the plurality of physical pages of the target wordline to serve as the target physical page according to the plurality of monitoring results of the plurality of physical pages of the selected target wordline.

After the target wordline is selected, the processor 211 can monitor the plurality of physical pages of the selected target wordline to obtain a plurality of monitoring results respectively corresponding to the plurality of physical pages. The monitoring result includes: (1) a plurality of error bit numbers respectively corresponding to the plurality of physical pages of the target wordline returned by the error checking and correcting circuit 214; and (2) the syndromes respectively corresponding to the plurality of physical pages of the target wordline.

Next, in step S23, the processor 211 determines, according to the plurality of monitoring results, whether a read voltage optimization operation needs to be performed to one target physical page of the plurality of physical pages. The processor 211 uses different determining methods in step S23 depending on different monitoring results.

Specifically, if the plurality of monitoring results are the plurality of error bit numbers respectively corresponding to the plurality of physical pages, the processor 211 determines whether the plurality of error bit numbers are greater than the error bit number threshold. In response to determining that a target error bit number of the plurality of error bit numbers is greater than the error bit number threshold, the physical page corresponding to the target error bit number is identified as the target physical page, and it is determined that the read voltage optimization operation needs to be performed to the target physical page of the plurality of physical pages of the target wordline.

On the other hand, if the plurality of monitoring results corresponding to the plurality of physical pages of the target wordline are a plurality of syndromes respectively corresponding to the plurality of physical pages, the processor 211 determines whether the total number of the first bit value (e.g., "1") of each of the plurality of syndromes is greater than a syndrome threshold. In response to determining that the total number of the first bit value of one target syndrome of the plurality of syndromes is greater than the syndrome threshold, the physical page corresponding to the target syndrome is identified as the target physical page, and it is determined that the read voltage optimization operation needs to be performed to the target physical page of the plurality of physical pages of the target wordline.

In another embodiment, if the plurality of monitoring results corresponding to the plurality of physical pages of the target wordline are a plurality of syndromes respectively corresponding to the plurality of physical pages, the processor 211 determines whether the total number of the second bit value (e.g., "0") of each of the plurality of syndromes is smaller than another syndrome threshold. In response to determining that the total number of the second bit value of a target syndrome of the plurality of syndromes is smaller than another syndrome threshold, the physical page corresponding to the target syndrome is identified as the target physical page, and it is determined that the read voltage optimization operation needs to be performed to the target physical page of the plurality of physical pages of the target wordline.

In response to determining that the read voltage optimization operation is not required to be performed to any one of the plurality of physical pages of the target wordline (step S23→No), the process flow proceeds to step S21. That is, the processor 211 may continue to select one of the plurality of wordlines as a target wordline, and monitors the plurality of physical pages of the selected target wordline to obtain a plurality of monitoring results respectively corresponding to the plurality of physical pages. On the contrary, in response to determining that the read voltage optimization operation needs to be performed to one target physical page of the plurality of physical pages of the target wordline (step S23→Yes), the process flow proceeds to step S25. On this occasion, the processor 211 instructs the read voltage management circuit unit 215 that the target physical page will be subjected to the read voltage optimization operation, and the read voltage management circuit unit 215 will perform step S25.

In other words, after performing step S23, the processor 211 can determine whether it is necessary to perform the read voltage optimization operation to one target physical page in the target wordline, or determine that it is not necessary to perform the read voltage optimization operation to any one of the physical page in the target wordline.

In step S25, the read voltage management circuit unit 215 (or the optimization count circuit 2151) is configured to update the target optimized count value corresponding to the target physical page. The details of step S25 will be described below with reference to FIG. 2B.

Figure 2B:
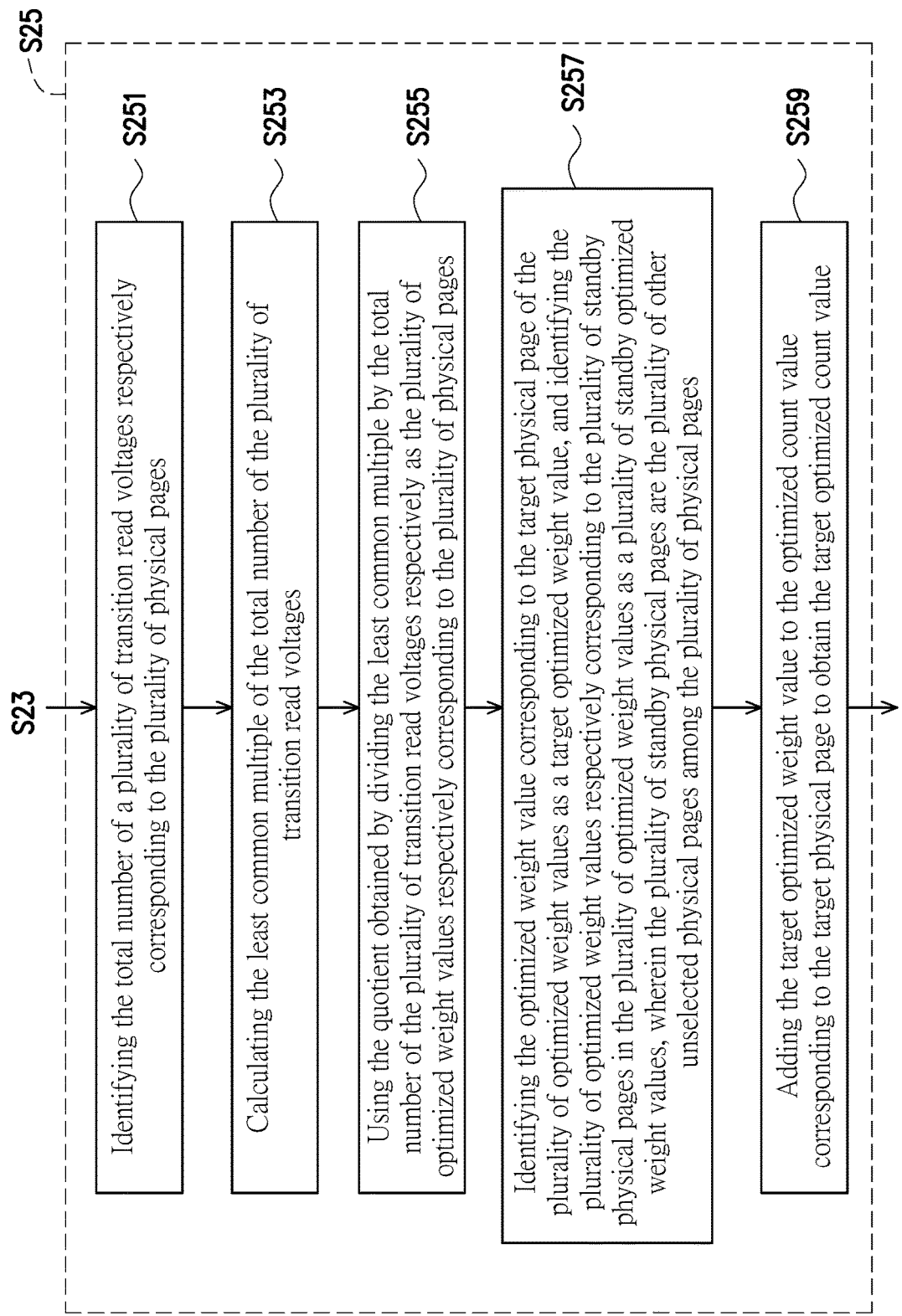
FIG. 2B is a flowchart of step S25 in FIG. 2 according to an embodiment of the disclosure.

FIG. 2B is a flowchart of step S25 in FIG. 2 according to an embodiment of the disclosure. Referring to FIG. 2B, in step S251, the optimization count circuit 2151 identifies the total number of a plurality of transition read voltages respectively corresponding to the plurality of physical pages.

Specifically, in the embodiment, as described above, the target wordline is stored with data. That is, the plurality of memory cells of each wordline of the target wordline are configured to be programmed to store the bit value corresponding to one of a plurality of different Gray Codes, and the total number of the Gray Codes is N. N is a positive integer greater than 2, and the value of N is preset according to the type of the rewritable non-volatile memory module 220. For example, if the rewritable non-volatile memory module 220 is TLC, N=8; if the rewritable non-volatile memory module 220 is MLC, N=4; if the rewritable non-volatile memory module 220 is SLC, then N=2; if the rewritable non-volatile memory module 220 is QLC, then N=16.

Figure 4A:
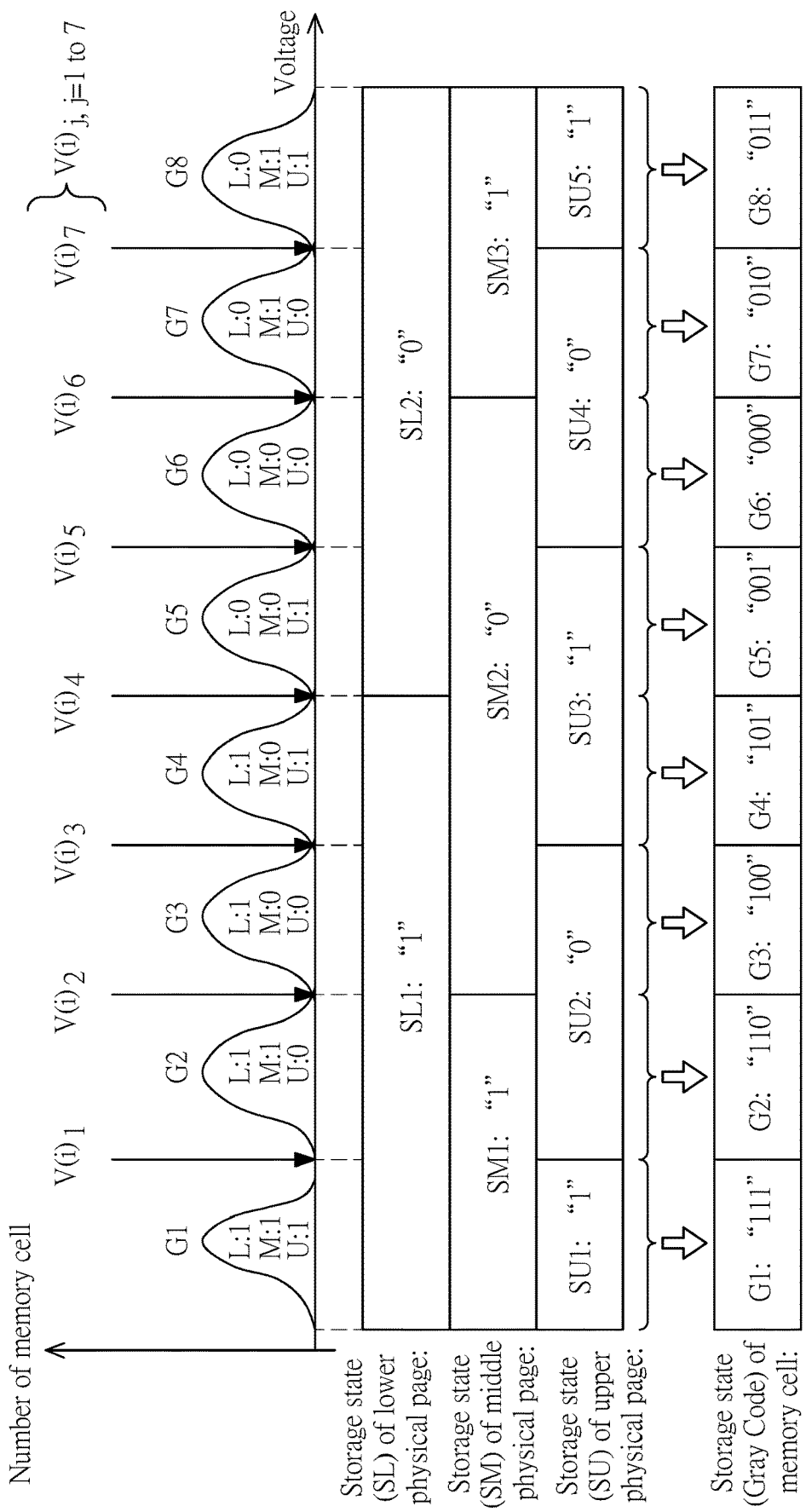
FIG. 4A is a schematic view showing a threshold voltage distribution of a plurality of memory cells of a wordline corresponding to a first read voltage state and a storage state of a corresponding physical page according to an embodiment of the disclosure.

For the consistency in description, this embodiment is exemplified by using the TLC NAND flash memory module, and the plurality of memory cells of the target wordline may be stored with bit values respectively corresponding to 8 Gray Codes (N=8). FIG. 4A is used first in the following embodiment to describe the details of the plurality of Gray Codes, a plurality of storage statuses corresponding to the plurality of physical pages and the plurality of corresponding transition read voltages.

FIG. 4A is a schematic view showing a threshold voltage distribution of a plurality of memory cells of a wordline corresponding to a first read voltage state and a storage state of a corresponding physical page according to an embodiment of the disclosure. The embodiment is exemplified by using the TLC NAND flash memory module as the rewritable non-volatile memory module 220, wherein N is equal to 8 (i.e., $2^3$). Each of the memory cells of the TLC NAND flash memory module has three physical pages for storing bit data respectively. Each of the memory cells includes a lower physical page (L), a middle physical page (M), and an upper physical page (U) capable of storing one bit value respectively. It is assumed that the processor 211 reads a plurality of memory cells (a plurality of target memory cells) of the target wordline of the TLC NAND flash memory module through a plurality of read voltages $V(i)_1$ to $V(i)_7$ of the read voltage set V(i), and thus identifying different bit values (bit values respectively corresponding to different Gray Codes) stored in the plurality of memory cells. The plurality of read voltages $V(i)_1$ to $V(i)_7$ constitute a corresponding read voltage set V(i) according to the sequence of the respective voltage values.

It is assumed that the rewritable non-volatile memory module 220 is the first read voltage state (1/2/4). The storage state in each memory cell may be categorized into 8 kinds of Gray Code, such as "L:1 M:1 U:1", "L:1 M:1 U:0", "L:1 M:0 U:0", "L:1 M:0 U:1", "L:0 M:0 U:1", "L:0 M:0 U:0", "L:0 M:1 U:0" and "L:0 M:1 U:1" ("L:" represents the bit value of the lower physical page; "M:" represents the bit value of the middle physical page; "U:" represents the bit value of the upper physical page), according to the read voltages $V(i)_1$ to $V(i)_7$ in the read voltage set V(i) (for example, a preset read voltage set corresponding to i equal to 1). The 8 types of Gray Code may also be expressed as the following 8 bit value combinations, namely "111", "110", "100", "101", "001", "000", "010" and "011", wherein the sequence of the bit values in each of the bit value combinations is based on the sequence of the lower, middle, and upper physical pages. That is, by respectively applying the read voltages $V(i)_1$ to $V(i)_7$ of different voltage values of the read voltage set V(i) to a memory cell of the target wordline, the processor 211 can respectively determine that the bit value (also referred to as a bit data or a read bit value) stored in the memory cell corresponds to one of the plurality of different Gray Codes ("111", "110", "100", "101", "001", "000", "010", and "011") according to whether the channel of the memory cell is conducted (i.e., the read bit value is read from one memory cell of the target wordline by using the read voltage set V(i)). It should be noted that the memory cells of the rewritable non-volatile memory module 220 may have a plurality number of Gray Codes (the number is 8 in the example), and the number of the plurality of read voltages of each read voltage set is the number of the plurality of Gray Codes deducted by 1 (the number is 7 in this example, i.e., N−1=8−1=7).

More specifically, the Gray Code stored in one memory cell may be combined in sequence through the storage state (SL) of the lower physical page of the memory cell, the storage status (SM) of the middle physical page and the storage state (SU) of the upper physical page (as shown by the multiple arrows in FIG. 4A).

In this embodiment, the read voltage $V(i)_4$ is used to distinguish the storage states SL1 ("1") and SL2 ("0") of the lower physical page; the read voltages $V(i)_2$ and $V(i)_6$ are used to distinguish the storage states SM1 ("1"), SM2 ("0"), and SM3 ("1") of the middle physical page; and the read voltages $V(i)_1$, $V(i)_3$, $V(i)_5$, and $V(i)_7$ are used to distinguish the storage states SU1 ("1"), SU2 ("0"), SU3 ("1"), SU4 ("0") and SU5 ("1") of the upper physical page. The above example may also be regarded as, the lower physical page has "1" transition read voltage, that is, the read voltage $V(i)_4$; the middle physical page has "2" transition read voltages, that is, read voltages $V(i)_2$ and $V(i)_6$; the upper physical page has "4" transition read voltages, that is, read voltages $V(i)_1$, $V(i)_3$, $V(i)_5$, $V(i)_7$.

That is to say, the total number of the transition read voltages of the lower physical page is "1"; the total number of transition read voltages of the middle physical page is "2"; and the total number of the transition read voltages of the upper physical page is "4". The rewritable non-volatile memory module 220 having the characteristics of the plurality of physical pages and the corresponding total number of transition read voltages may also be regarded as the rewritable non-volatile memory module 220 (TLC NAND flash memory module) having the first read voltage state (1/2/4). The "1/2/4" respectively correspond to the total number of transition read voltages of the "lower physical page/middle physical page/upper physical page".

The processor 211 (or read voltage management circuit unit 215) may use a transition read voltage in the preset read voltage set corresponding to the lower physical page, the middle physical page, and the upper physical page to read the wordline sequentially, thereby obtaining the storage states of the lower physical page, the middle physical page, and the upper physical page of the plurality of memory cells of the wordline, thus obtaining the Gray Codes of the plurality of memory cells. For example, assume that the processor 211 (or the read voltage management circuit unit 215) uses the read voltage V(i) to read the wordline to obtain a plurality of Gray Codes of the plurality of memory cells of the wordline. The processor 211 (or the read voltage management circuit unit 215) first identifies whether the storage state of the lower physical page of all the memory cells is the storage state SL1 or the storage state SL2 by using the read voltage $V(i)_4$; then, the processor 211 (or the read voltage management circuit unit 215) identifies whether the storage state of the middle physical page in the memory cells is the storage state SM1, the storage state SM2, or the storage state SM3 by using the read voltages $V(i)_2$, $V(i)_6$; then, the processor 211 (or the read voltage management circuit unit 215) identifies whether the storage state of the upper physical page of the memory cells is the storage state SU1, the storage state SU2, the storage state SU3, the storage state SU4 or storage state SM5 by using the reads voltages $V(i)_1$, $V(i)_3$, $V(i)_5$, $V(i)_7$. In this way, the processor 211 (or the read voltage management circuit unit 215) can identify the storage states of the lower physical page, the middle physical page, and the upper physical page of all the memory cells, thus identifying the Gray Codes stored in all the memory cells.

However, the disclosure is not limited thereto. The data reading method, the storage controller and the storage device provided by the embodiments of the disclosure are also adapted for the rewritable non-volatile memory modules with other read voltage states. For example, in one embodiment, the rewritable non-volatile memory module 220 is a second read voltage state (2/3/2).

Figure 5A:
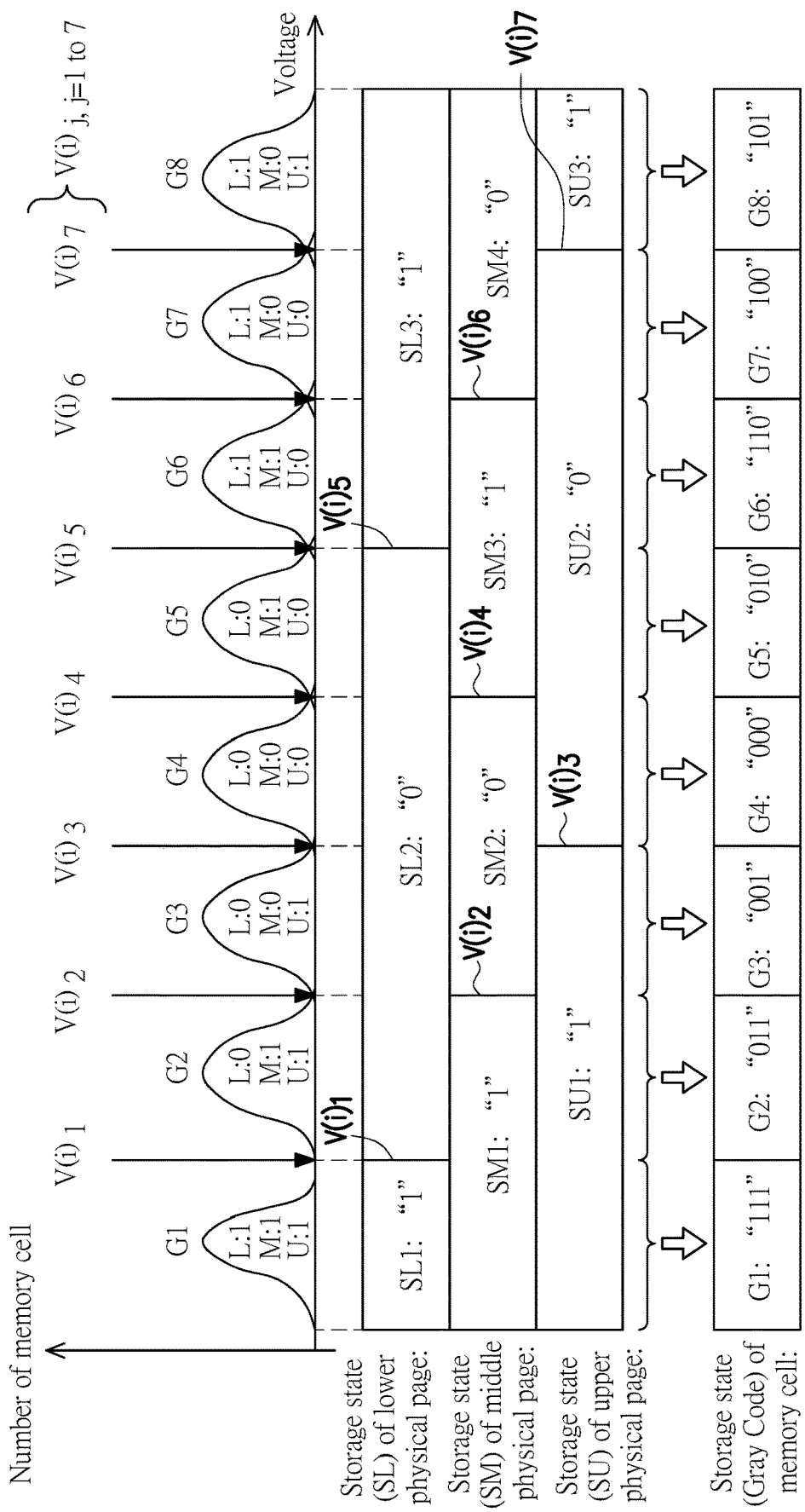
FIG. 5A is a schematic view showing a threshold voltage distribution of a plurality of memory cells of a wordline corresponding to a second read voltage state and a storage state of a corresponding physical page according to an embodiment of the disclosure.

FIG. 5A is a schematic view showing a threshold voltage distribution of a plurality of memory cells of a wordline corresponding to a second read voltage state and a storage state of a corresponding physical page according to an embodiment of the disclosure.

Referring to FIG. 5A, it is assumed that the rewritable non-volatile memory module 220 is a second read voltage state (2/3/2). The storage state in each memory cell may be categorized into 8 kinds of Gray Code, such as "L:1 M:1 U:1", "L:0 M:1 U:1", "L:0 M:0 U:1", "L:0 M:0 U:0", "L:0 M:1 U:0", "L:1 M:1 U:0", "L:1 M:0 U:0" and "L:1 M:0 U:1" ("L:" represents the bit value of the lower physical page; "M:" represents the bit value of the middle physical page; "U:" represents the bit value of the upper physical page), according to the read voltages $V(i)_1$ to $V(i)_7$ in the read voltage set V(i) (for example, a preset read voltage set corresponding to i equal to 1). The 8 types of Gray Code may also be expressed as the following 8 bit value combinations, namely "111", "011", "001", "000", "010", "110", "100" and "101", wherein the sequence of the bit values in each of the bit value combinations is based on the sequence of the lower, middle, and upper physical pages. That is, by respectively applying the read voltages $V(i)_1$ to $V(i)_7$ of different voltage values of the read voltage set V(i) to a memory cell of the target wordline, the processor 211 can respectively determine that the bit value (also referred to as a bit data or a read bit value) stored in the memory cell corresponds to one of the plurality of different Gray Codes ("111", "011", "001", "000", "010", "110", "100" and "101") according to whether the channel of the memory cell is conducted (i.e., the read bit value is read from one memory cell of the target wordline by using the read voltage set V(i)). It should be noted that the memory cells of the rewritable non-volatile memory module 220 may have a plurality number of Gray Codes (the number is 8 in the example), and the number of the plurality of read voltages of each read voltage set is the number of the plurality of Gray Codes deducted by 1 (the number is 7 in this example, i.e., N−1=8−1=7).

For the rewritable non-volatile memory module 220 (TLC NAND flash memory module) of the second read voltage state (2/3/2), the read voltages $V(i)_1$ and $V(i)_5$ are used to distinguish the storage states SL1 ("1"), SL2 ("0"), and SL3 ("1") of the lower physical page; the read voltages $V(i)_2$, $V(i)_4$ and $V(i)_6$ are used to distinguish the storage states SM1 ("1"), SM2 ("0"), SM3 ("1") and SM4 ("0") of the middle physical page; and the read voltages $V(i)_3$ and $V(i)_7$ are used to distinguish storage states SU1 ("1"), SU2 ("0"), and SU3

("1") of the upper physical page. According to the above example, it can be regarded as that the lower physical page of the memory cell of the rewritable non-volatile memory module 220 (TLC NAND flash memory module) with the second read voltage state (2/3/2) has "2" transition read voltages, that is, the read voltages $V(i)_1$ and $V(i)_5$; the middle physical page has "3" transition read voltages, that is, the read voltages $V(i)_2$, $V(i)_4$ and $V(i)_6$; and the upper physical page has "2" transition read voltages, that is, the read voltages $V(i)_3$ and $V(i)_7$.

That is to say, the total number of the transition read voltages of the lower physical page is "2"; the total number of transition read voltages of the middle physical page is "3"; and the total number of the transition read voltages of the upper physical page is "2". The rewritable non-volatile memory module 220 having the characteristics of the plurality of physical pages and the corresponding total number of transition read voltages may also be regarded as the rewritable non-volatile memory module 220 (TLC NAND flash memory module) having the second read voltage state (2/3/2). The "2/3/2" respectively corresponds to the total number of transition read voltages of the "lower physical page/middle physical page/upper physical page".

Returning to FIG. 2B, after identifying the total number of the plurality of transition read voltages respectively corresponding to the plurality of physical pages, next, in step S253, the optimization count circuit 2151 calculates the least common multiple of the total number of the plurality of transition read voltages.

Figure 4B:
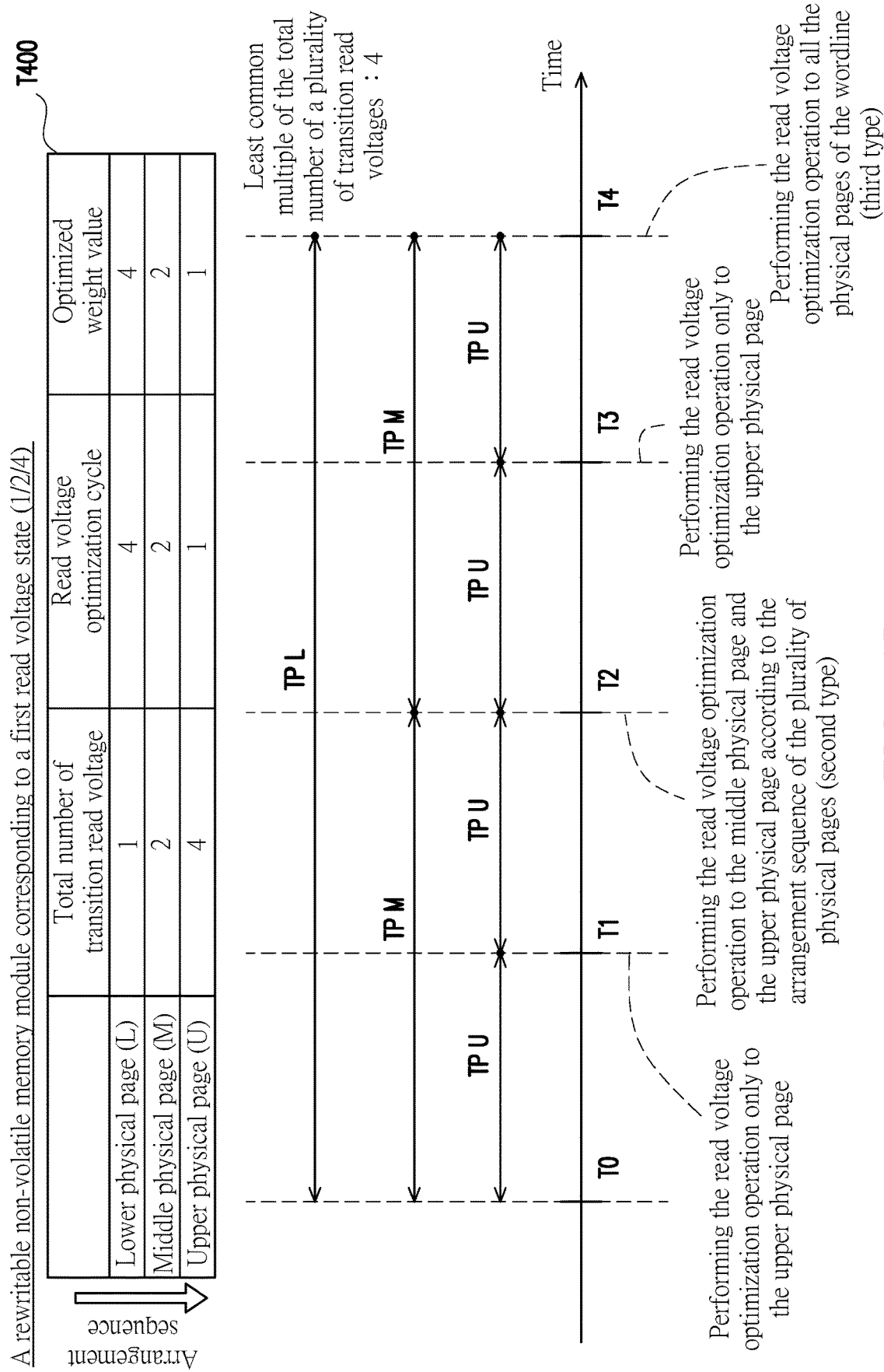
FIG. 4B is a schematic view showing a read voltage optimization cycle of each of a plurality of physical pages of a wordline corresponding to a first read voltage state according to an embodiment of the disclosure.

FIG. 4B is a schematic view showing a read voltage optimization cycle of each of a plurality of physical pages of a wordline corresponding to a first read voltage state according to an embodiment of the disclosure. Referring to FIG. 4B, in this example, it is assumed that the rewritable non-volatile memory module 220 corresponds to the first read voltage state (1/2/4). The optimization count circuit 2151 has identified that the total number of transition read voltages of the lower physical page is "1"; the total number of transition read voltages of the middle physical page is "2"; and the total number of transition read voltages of the upper physical page is "4".

First of all, it should be noted that since the storage state of each physical page is differentiated/identified according to the total number of transition read voltages, if a physical page has more transition read voltages (i.e., the total number of transition read voltages is larger), the more storage states of physical page need to be distinguished. For example, in this embodiment (see FIG. 4A), the total number of the transition read voltages of the upper physical page is "4", and the upper physical page has the most storage states (having 5 storage states that are distinguished by 4 transition read voltages).

Second, when the reading status of one physical page is relatively poor (for example, the corresponding data read operation fails or the decoding of the read data fails), it indicates that one or more transition read voltages corresponding to the physical page can no longer accurately identify/distinguish the storage state of this physical page. This phenomenon may also be regarded as that one or more transition read voltages become invalid.

Based on the above, it is assumed that the probability for each transition read voltage to fail is equal (or the frequency at which each transition read voltage needs to be subjected to optimization operation is the same), for one physical page having more transition read voltages (e.g., having more differentiated storage states), the probability that the transition read voltage of this physical page will fail is higher. In other words, for a physical page with more transition read voltages (e.g., having more differentiated storage states), the probability that the data read operation corresponding to the physical page is determined to be failed will be higher (or the probability that the decoding operation performed to the data read from the physical page is determined to be failed will be higher), and the transition read voltage of the physical page needs to be subjected to optimization operation more frequently (i.e., the frequency of having to perform the read voltage optimization operation to this physical page will be higher). That is to say, the execution cycle (also referred to as the read voltage optimization cycle) of the read voltage optimization operation performed to different physical pages may be set according to the total number of transition read voltages of the corresponding physical pages. The physical page with a larger total number of transition read voltages will have a smaller read voltage optimization cycle.

Specifically, as shown in Table T400, the total number of transition read voltages corresponding to the identified lower physical page is "1", the total number of transition read voltages of the middle physical page is "2", and the total number of transition read voltages of the upper physical page is "4". The optimization count circuit 2151 may set the read voltage optimization cycle of the lower physical page to be "4", the read voltage optimization cycle of the middle physical page to be "2", and the read voltage optimization cycle of the upper physical page to be "1".

In an embodiment, the optimization count circuit 2151 may first calculate the least common multiple of the total number of the plurality of transition read voltages, for example, "4" (step S253). Next, in step S255, the optimization count circuit 2151 may use the quotient obtained by dividing the least common multiple by the total number of the plurality of transition read voltages respectively as the plurality of read voltage optimization cycles (i.e., optimized weight value) respectively corresponding to the plurality of physical pages. The read voltage optimization cycle may also be used as an optimized weight value for accumulating a plurality of optimized count values corresponding to the plurality of physical pages.

In an embodiment, the optimization count circuit 2151 may calculate a plurality of read voltage optimization cycles (or optimized weight values) corresponding to the physical page according to respective reciprocals of the total number of the plurality of transition read voltages.

After obtaining the plurality of read voltage optimization cycles corresponding to the plurality of physical pages, the read voltage management circuit unit 215 (or the read voltage optimization circuit 2152) can determine the execution frequency of the read voltage optimization operation required for each of the physical pages. As such, the read voltage management circuit unit 215 (or the read voltage optimization circuit 2152) may further determine whether to perform the read voltage optimization operation to other physical pages according to the plurality of read voltage optimization cycles when it is determined that the target physical page is to be subjected to the read voltage optimization operation.

For example, referring to the lower part of FIG. 4B, it is assumed that the time intervals between every two adjacent time points in the plurality of time points T0 to T4 are equal, and each is a unit optimization period. In addition, it is assumed that the read voltage optimization cycle $TP_L$ of the current lower physical page is "4" unit optimization period, the read voltage optimization cycle $TP_M$ of the middle physical page is "2" unit optimization period, and the read voltage optimization cycle $TP_U$ of the upper physical page is "1" unit optimization period.

For example, since the read voltage optimization cycle $TP_U$ of the upper physical page is "1" unit optimization period, when the time is from the time point T0 to the time point T1, the read voltage optimization circuit 2152 determines that one time of page level read voltage optimization operation (as indicated by a dark dot corresponding to the time point T1) needs to be performed to the upper physical page. On this occasion, (time point T1), since the time does not reach the read voltage optimization cycle $TP_M$ of the middle physical page and the read voltage optimization cycle $TP_L$ of the lower physical page, the read voltage optimization circuit 2152 determines that it is not necessary to perform the page level read voltage optimization operation to the middle physical page and the lower physical page, that is, the page level read voltage optimization operation is performed only to the upper physical page.

Following the above example, it is assumed that another unit optimization period has elapsed and the time has reached the time point T2. The upper physical page passes another read voltage optimization cycle $TP_U$, and the read voltage optimization circuit 2152 determines that the page level read voltage optimization operation needs to be performed to the upper physical page. Further, starting from the time point T0, the middle physical page also passes a read voltage optimization cycle $TP_M$ (the time length of 2 unit optimization period), and the read voltage optimization circuit 2152 determines that the page level read voltage optimization operation (as indicated by the dark dot corresponding to the time point T2) needs to be performed to the middle physical page.

Following the above example, it is assumed that another unit optimization period has elapsed and the time has reached the time point T3. Since the time does not reach the read voltage optimization cycle $TP_M$ of the middle physical page and the read voltage optimization cycle $TP_L$ of the lower physical page, the read voltage optimization circuit 2152 determines that it is not necessary to perform the page level read voltage optimization operation to the middle physical page and the lower physical page, that is, the page level read voltage optimization operation (as indicated by the dark dot corresponding to the time point T3) is performed only to the upper physical page.

Following the above example, it is assumed that another unit optimization period has elapsed, and the time has reached the time point T4. The upper physical page passes another read voltage optimization cycle $TP_U$, and the read voltage optimization circuit 2152 determines that the page level read voltage optimization operation needs to be performed to the upper physical page. Further, starting from the time point T0, the lower physical page also passes a read voltage optimization cycle $TP_L$ (time length of 4 unit optimization period), and the read voltage optimization circuit 2152 determines that the page level read voltage optimization operation needs to be performed to the middle physical page; starting from the time point T2 at which the middle physical page is subjected to the read voltage optimization operation previously, the middle physical page also passes another read voltage optimization cycle $TP_M$ (the length of 2 unit optimization period), and the read voltage optimization circuit 2152 determines that the page level read voltage optimization operation (as indicated by the dark dot corresponding to time point T4) needs to be performed to the middle physical page. That is, at the time point T4, the read voltage optimization circuit 2152 can determine that the page level read voltage optimization operation needs to be performed to all the physical pages, or that it is necessary to perform the wordline level read voltage optimization operation to the wordline to which all the physical pages belong.

Briefly, according to the example provided in the lower part of FIG. 4B, according to the read voltage optimization cycle $TP_L$ of the lower physical page/the read voltage optimization cycle $TP_M$ of the middle physical page/the read voltage optimization cycle $TP_U$ of the upper physical page, namely "1/2/4", the read voltage optimization circuit 2152 can determine whether the read voltage optimization operation also needs to be performed to other physical pages according to the current physical page to be subjected to the read voltage optimization operation.

For example, for the example of FIG. 4B, every time when the page level read voltage optimization operation is performed twice on the upper physical page, the read voltage optimization circuit 2152 can predict that the page level read voltage optimization operation also needs to be performed once on the middle physical page. Every time when the page level read voltage optimization operation is performed four times on the upper physical page, the read voltage optimization circuit 2152 can predict that the page level read voltage optimization operation also needs to be performed once on the middle physical page, and predict that the page level read voltage optimization operation also needs to be performed once on the lower physical page. Every time when the page level read voltage optimization operation is performed once on the middle physical page, the read voltage optimization circuit 2152 can predict that the page level read voltage optimization operation also needs to be performed once on the upper physical page. Every time when the page level read voltage optimization operation is performed twice on the middle physical page, the read voltage optimization circuit 2152 can predict that the page level read voltage optimization operation also needs to be performed once on the upper physical page, and predict that the page level read voltage optimization operation also needs to be performed once on the lower physical page. Every time when the page level read voltage optimization operation is performed once on the lower physical page, the read voltage optimization circuit 2152 can predict that the page level read voltage optimization operation also needs to be performed once on the middle physical page, and predict that the page level read voltage optimization operation also needs to be performed once on the upper physical page.

The above is an example of the rewritable non-volatile memory module 220 corresponding to the first read voltage state (1/2/4). However, the above concept may also be adapted to the rewritable non-volatile memory module 220 corresponding to the second read voltage state (2/3/2) or the rewritable non-volatile memory module 220 with other read voltage state. Next, the rewritable non-volatile memory module 220 corresponding to the second read voltage state (2/3/2) will be described with reference to FIG. 5B.

Figure 5B:
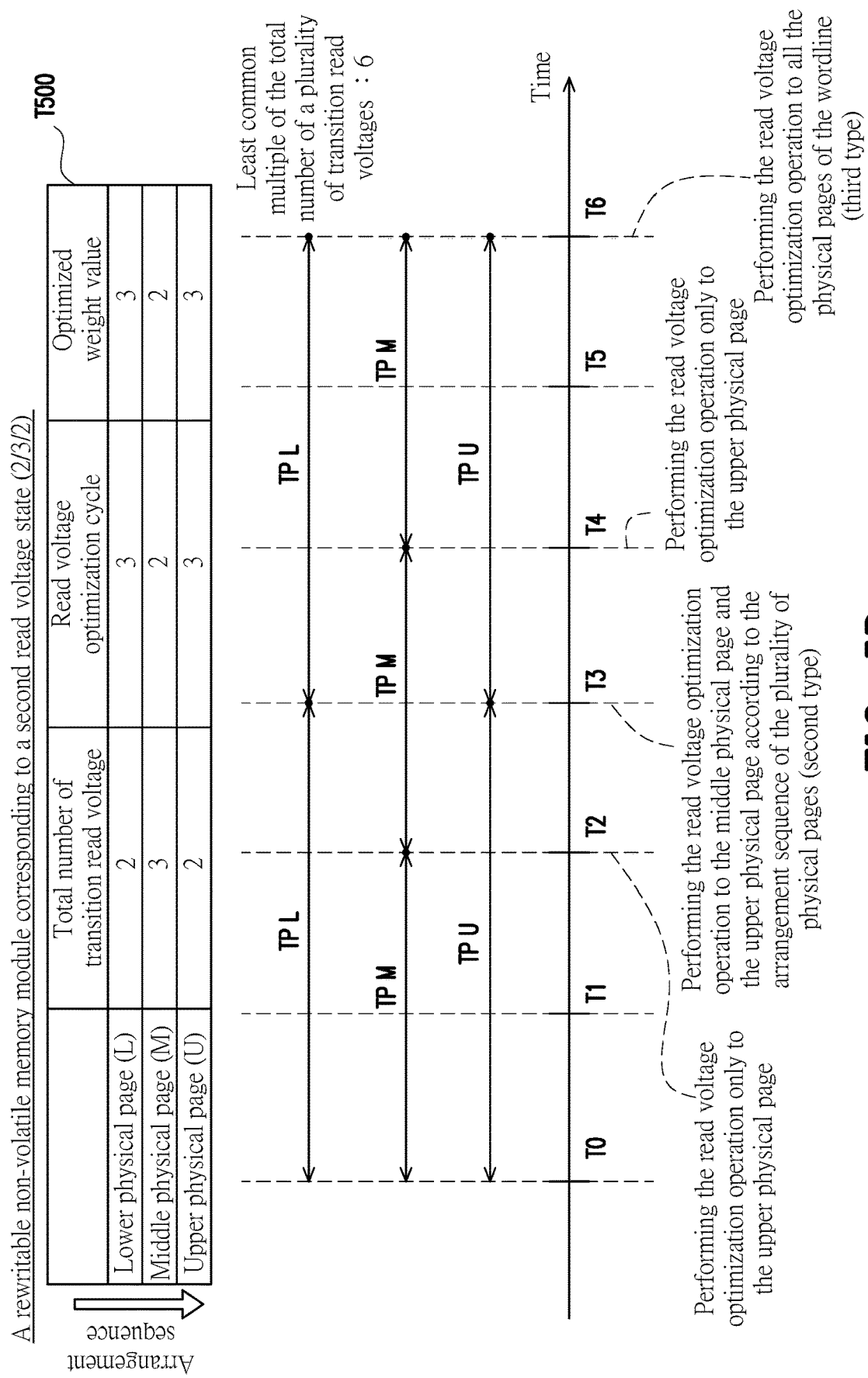
FIG. 5B is a schematic view showing a read voltage optimization cycle of each of a plurality of physical pages of a wordline corresponding to a second read voltage state according to an embodiment of the disclosure.

FIG. 5B is a schematic view showing a read voltage optimization cycle of each of a plurality of physical pages of a wordline corresponding to a second read voltage state according to an embodiment of the disclosure. Referring to FIG. 5B, in this example, it is assumed that the rewritable non-volatile memory module 220 corresponds to the second read voltage state (2/3/2). The optimization count circuit 2151 has identified that the total number of transition read voltages of the lower physical page is "2"; the total number of transition read voltages of the middle physical page is "3"; and the total number of transition read voltages the upper physical page is "2".

Specifically, as shown in the table T500, the optimization count circuit 2151 has identified that the total number of transition read voltages of the lower physical page is "2", and the total number of transition read voltages of the middle physical page is "3" and the total number of transition read voltages of the upper physical page is "2". Next, the optimization count circuit 2151 may first calculate the least common multiple of the total number of the plurality of transition read voltages, for example, "6" (step S253). Then, the optimization count circuit 2151 may use the quotient obtained by dividing the least common multiple by the total number of the plurality of transition read voltages respectively as the plurality of read voltage optimization cycles (also referred to as optimized weight value) respectively corresponding to the plurality of physical pages (step S255). That is, the optimization count circuit 2151 can calculate that the read voltage optimization cycle of the lower physical page is "3", the read voltage optimization cycle of the middle physical page is "2", and the read voltage optimization cycle of the upper physical page is "3".

Referring to the lower part of FIG. 5B, it is assumed that the time intervals between every two adjacent time points in the plurality of time points T0 to T6 are equal, and each is a unit optimization period. In addition, it is assumed that the read voltage optimization cycle $TP_L$ of the current lower physical page is "3" unit optimization period, the read voltage optimization cycle $TP_M$ of the middle physical page is "2" unit optimization period, and the read voltage optimization cycle $TP_U$ of the upper physical page is "3" unit optimization period.

For example, since the read voltage optimization cycle $TP_M$ of the middle physical page is "2" unit optimization period, and the time has passed 2 unit optimization period from the time point T0 to the time point T2, the read voltage optimization circuit 2152 determines that one time of page level read voltage optimization operation (as indicated by a dark dot corresponding to the time point T2) needs to be performed to the middle physical page. On this occasion (time point T2), since the time does not reach the read voltage optimization cycle $TP_U$ of the upper physical page and the read voltage optimization cycle $TP_L$ of the lower physical page, the read voltage optimization circuit 2152 determines that it is not necessary to perform the page level read voltage optimization operation to the upper physical page and the lower physical page, that is, the page level read voltage optimization operation is performed only to the middle physical page.

Following the above example, it is assumed that another unit optimization period has elapsed, and the time has reached the time point T3. Starting from the time point T0, the lower physical page has passed a read voltage optimization cycle $TP_L$ (the time length of three unit optimization period), and the read voltage optimization circuit 2152 determines that the page level read voltage optimization operation needs to be performed to the lower physical page. Further, from the time point T0, the upper physical page also passes a read voltage optimization cycle $TP_U$ (the time length of three unit optimization period), and the read voltage optimization circuit 2152 determines that the page level read voltage optimization operation (as indicated by the dark dot corresponding to the time point T3) needs to be performed to the upper physical page. That is to say, at the time point T3, the read voltage optimization circuit 2152 determines that both of the lower physical page and the upper physical page need to be subjected to the page level read voltage optimization operation.

Following the above example, it is assumed that another unit optimization period has passed, and the time has reached the time point T4. Since the time does not reach the read voltage optimization cycle $TP_U$ of the upper physical page and the read voltage optimization cycle $TP_L$ of the lower physical page, the read voltage optimization circuit 2152 determines that it is not necessary to perform the page level read voltage optimization operation to the upper physical page and the lower physical page. In addition, when the time passes from time T2 to time T4, a read voltage optimization cycle $TP_M$ ("2" unit optimization period) has passed relative to the previously performed read voltage optimization operation. Based on this, the read voltage optimization circuit 2152 determines that the page level read voltage optimization operation (as indicated by the dark dot corresponding to the time point T3) is performed only to the middle physical page.

Following the above example, it is assumed that another unit optimization period has elapsed and the time has reached the time point T5. Since the time does not reach the read voltage optimization cycle $TP_U$ of the upper physical page, the read voltage optimization cycle $TP_M$ of the middle physical page, and the read voltage optimization cycle $TP_L$ of the lower physical page relative to the read voltage optimization operation performed last time, the read voltage optimization circuit 2152 determines that it is not necessary to perform the page level read voltage optimization operation to the upper physical page, the middle physical page and the lower physical page.

Following the above example, it is assumed that another unit optimization period has elapsed and the time has reached the time point T6. From the read voltage optimization operation (time point T3) performed last time, the upper physical page has passed another read voltage optimization cycle $TP_U$ (the time length of 3 unit optimization period), and the read voltage optimization circuit 2152 determines that the page level read voltage optimization operation needs to be performed to the upper physical page. In addition, from the read voltage optimization operation (time point T3) performed last time, the lower physical page has passed another read voltage optimization cycle $TP_L$ (the time length of 3 unit optimization period), and the read voltage optimization circuit 2152 determines that the page level read voltage optimization operation needs to be performed to the lower physical page. In addition, from the read voltage optimization operation (time point T4) performed last time, the middle physical page has passed another read voltage optimization cycle $TP_M$ (the time length of 2 unit optimization period), and the read voltage optimization circuit 2152 determines that the page level read voltage optimization operation needs to be performed to the middle physical page. That is, at time point T6, the read voltage optimization circuit 2152 can determine that the page level read voltage optimization operation needs to be performed to all the physical pages, or that the wordline level read voltage optimization operation needs to be performed to the wordline to which all the physical pages belong.

Briefly, according to the example at the lower part of FIG. 5B, according to the read voltage optimization cycle $TP_L$ of the lower physical page/the read voltage optimization cycle $TP_M$ of the middle physical page/the read voltage optimization cycle $TP_U$ of the upper physical page, namely "2/3/2", the read voltage optimization circuit 2152 can determine whether the read voltage optimization operation also needs to be performed to other physical pages according to the current physical page to be subjected to the read voltage optimization operation.

For instance, for the example of FIG. 5B, every time when the page level read voltage optimization operation is performed once to the upper physical page, the read voltage optimization circuit 2152 can predict that the page level read voltage optimization operation also needs to be performed once to the lower physical page; every time when the page level read voltage optimization operation is performed twice to the upper physical page, the read voltage optimization circuit 2152 can predict that the page level read voltage optimization operation also needs to be performed once on the middle physical page; every time when the page level read voltage optimization operation is performed three times on the middle physical page, the read voltage optimization circuit 2152 can predict that the page level read voltage optimization operation also needs to be performed once on the upper physical page and the lower physical page.

It should be noted that in this embodiment, the page level read voltage optimization operation performed to a single physical page of the target wordline may also be referred to as the first type read voltage optimization operation; the plurality of page level read voltage optimization operations respectively performed to a portion of the plurality of physical pages (not all physical pages) of the target wordline may also be referred to as a second type read voltage optimization operation; the plurality of page level read voltage optimization operations respectively performed to all the physical pages of the target wordline may also be referred to as a third type read voltage optimization operation. In addition, in the embodiment, the third type read voltage optimization operation can also be implemented by directly performing a wordline level read voltage optimization operation to the target wordline.

In order to facilitate the determination of whether to perform the first type read voltage operation, the second type read voltage operation, or the third type read voltage operation, the embodiment provides the optimization count circuit 2151 for calculating a plurality of optimized weight values respectively corresponding to the plurality of physical pages, and recording a plurality of optimized count values corresponding to the plurality of physical pages. The optimized weight values corresponding to the plurality of physical pages are given according to the plurality of read voltage optimization cycles of the plurality of physical pages. In addition, when the read voltage optimization operation is to be performed to one target physical page, the optimized count value of the target physical page is accumulated by using the corresponding optimized weight value, thereby determining whether to perform the read voltage optimization operation to other physical pages (also referred to as standby physical page) according to the accumulated optimized count value.

Returning to FIG. 2B, after obtaining a plurality of optimized weight values (i.e., the plurality of corresponding read voltage optimization cycles) respectively corresponding to the plurality of physical pages, next, in step S257, the optimization count circuit 2151 identifies the optimized weight value corresponding to the target physical page of the plurality of optimized weight values as a target optimized weight value, and identifies the plurality of optimized weight values respectively corresponding to the plurality of standby physical pages in the plurality of optimized weight values as a plurality of standby optimized weight values, wherein the plurality of standby physical pages are the plurality of other unselected physical pages among the plurality of physical pages. For example, take FIG. 4B as an example. If the lower physical page is the target physical page, the target optimized weight value is 4, and both the upper physical page and the middle physical page are standby physical pages, and the corresponding standby optimized weight values are 1 and 2.

Next, in step S259, the optimization count circuit 2151 adds the target optimized weight value to the optimized count value corresponding to the target physical page to obtain the target optimized count value. In this way, the optimization count circuit 2151 completes the step of updating the target optimized count value corresponding to the target physical page. For example, take FIG. 4B as an example. Assume that the lower physical page is the target physical page, the target optimized weight value is 4, and the current optimized count value corresponding to the lower physical page is 0. The optimization count circuit 2151 adds the target optimized weight value ("4") to the optimized count value ("0") corresponding to the target physical page to obtain the updated target optimized count value (i.e., "4").

After updating the target optimized count value corresponding to the target physical page, the process flow proceeds to step S27.

Referring to FIG. 2A, in step S27, the read voltage optimization circuit 2152 performs a first type read voltage optimization operation corresponding to the target wordline, a second type read voltage optimization operation or a third type read voltage optimization operation according to the target optimized count value, thereby obtaining an optimized read voltage set corresponding to the target wordline, wherein the target wordline may be read by using the optimized read voltage set. The implementation of step S27 provided by different embodiments will be described below with reference to FIG. 3A and FIG. 3B.

Figure 3A:
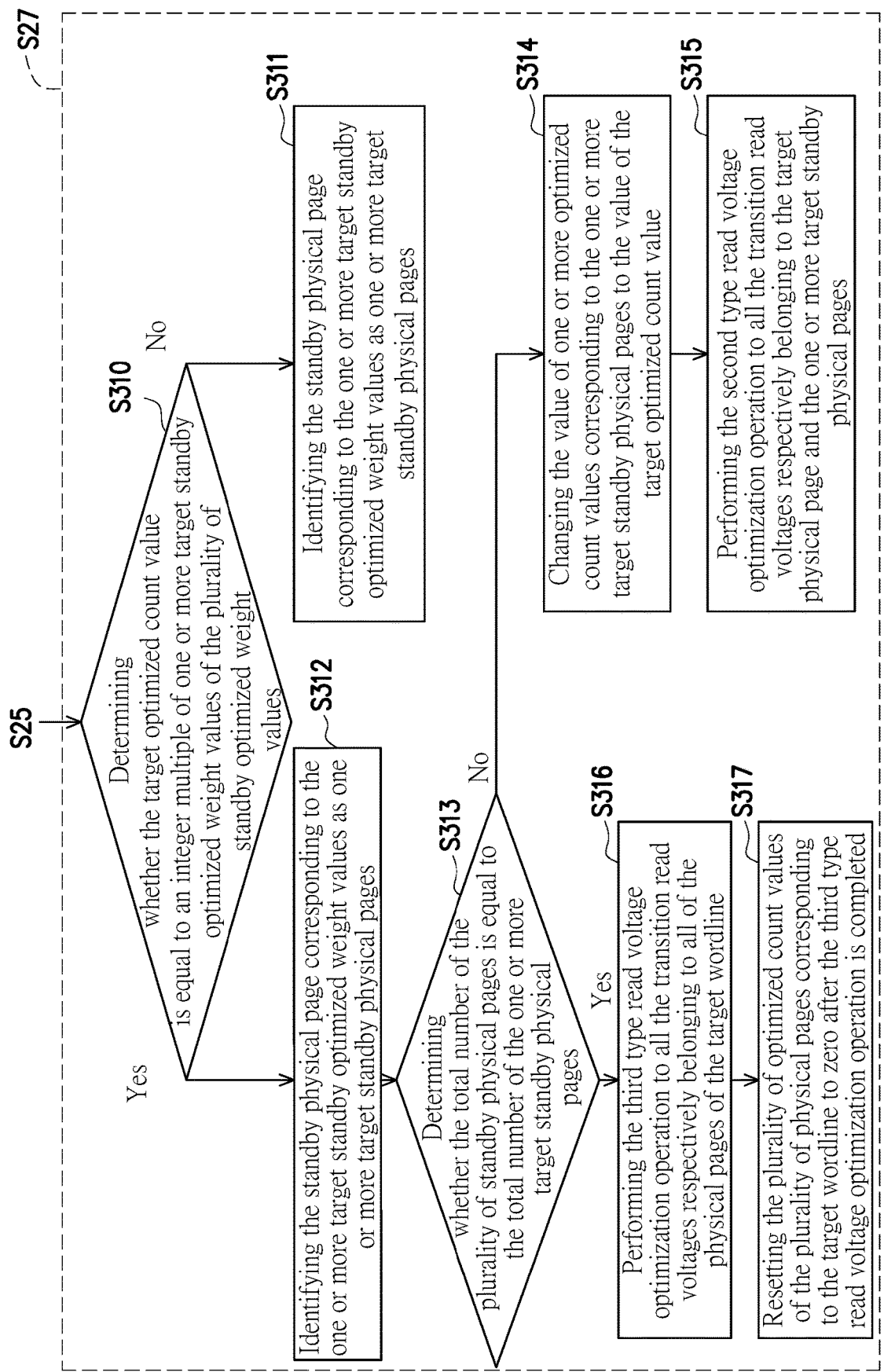
FIG. 3A is a flowchart of step S27 in FIG. 2 according to an embodiment of the disclosure.

FIG. 3A is a flowchart of step S27 in FIG. 2 according to an embodiment of the disclosure. Referring to FIG. 3A, in step S310, the read voltage optimization circuit 2152 determines whether the target optimized count value is equal to an integer multiple of one or more target standby optimized weight values of the plurality of standby optimized weight values. In response to determining that the target optimized count value is not equal to an integer multiple of any one of the plurality of optimized weight values respectively corresponding to the plurality of standby physical pages (step S310→No), the process flow proceeds to step S311. In response to determining that the target optimized count value is equal to an integer multiple of the one or more target standby optimized weight values of the plurality of standby optimized weight values (step S310→Yes), the process flow proceeds to step S312.

For example, taking FIG. 4B as an example, assume that the target physical page is an upper physical page, and the standby physical page is a middle physical page and a lower physical page, and the corresponding standby optimized weight values are 2 and 4 respectively. Further, it is assumed that the optimized count value (target optimized count value) of the updated upper physical page is 1 (e.g., the upper physical page is, for example, at the time point T1). On this occasion, the target optimized count value (i.e., 1) of the target physical page is not an integer multiple of the standby optimized weight value (i.e., 2) of the middle physical page (one of the standby physical pages), and the target optimized count value (i.e., 1) of the target physical page is not an integer multiple of the standby optimized weight value (i.e., 4) of the lower physical page (another one of the standby physical pages), then the read voltage optimization circuit 2152 executes step S311 to perform the first type read voltage optimization operation to all the transition read voltages of the target physical page.

The first type read voltage optimization operation includes: performing a page level read voltage optimization operation only to the target physical page, wherein in the page level read voltage optimization operation performed to the target physical page, the voltage value of one or more transition read voltages for identifying the storage state of the target physical page in the plurality of preset read voltages of a preset read voltage set corresponding to the target wordline is adjusted to an optimized value, thereby obtaining the optimized read voltage set corresponding to the target wordline.

For example, in this example, the read voltage optimization circuit 2152 performs the first type read voltage optimization operation only to the target physical page (upper physical page). That is, the read voltage optimization circuit 2152 performs the page level read voltage optimization operation only to all the transition read voltages (e.g., transition read voltages $V(\mathbf{1})_1$, $V(\mathbf{1})_3$, $V(\mathbf{1})_5$, $V(\mathbf{1})_7$) belonging to the target physical page (upper physical page), thereby adjusting the voltage values of each of the transition read voltages $V(\mathbf{1})_1$, $V(\mathbf{1})_3$, $V(\mathbf{1})_5$, $V(\mathbf{1})_7$ to the optimized value and obtaining the optimized transition read voltages (e.g., the optimized transition read voltages $V(X)_1$, $V(X)_3$, $V(X)_5$, $V(X)_7$), and the obtained optimized transition read voltages $V(X)_1$, $V(X)_3$, $V(X)_5$, $V(X)_7$ replace the preset transition read voltages $V(\mathbf{1})_1$, $V(\mathbf{1})_3$, $V(\mathbf{1})_5$, $V(\mathbf{1})_7$ corresponding to the upper physical page in the preset read voltage set $V(\mathbf{1})$ of the target wordline, thus obtaining the optimized read voltage set corresponding to the target wordline.

Similarly, in another example, it is assumed that the target physical page is an upper physical page, and the standby physical page is a middle physical page and a lower physical page, and the corresponding standby optimized weight values are 2 and 4 respectively. Further, it is assumed that the optimized count value (target optimized count value) of the updated upper physical page is 3 (e.g., upper physical page is, for example, at the time point T3). The read voltage optimization circuit 2152 performs the first type read voltage optimization operation only to the target physical page (upper physical page).

Returning to FIG. 3A, in response to determining that the target optimized count value is equal to an integer multiple of the one or more target standby optimized weight values of the plurality of standby optimized weight values (step S310→Yes), in step S312, the read voltage optimization circuit 2152 identifies the standby physical page corresponding to the one or more target standby optimized weight values as one or more target standby physical pages.

For example, it is assumed that the target physical page is an upper physical page, and the standby physical page is a middle physical page and a lower physical page, and the corresponding standby optimized weight values are 2 and 4 respectively. Further, it is assumed that the optimized count value (target optimized count value) of the updated upper physical page is 2 (e.g., the upper physical page is, for example, at the time point T2). On this occasion, the target optimized count value (2) of the target physical page is an integer multiple (i.e., 1 time) of the standby optimized weight value (i.e., 2) of the middle physical page (one of the standby physical pages). However, the target optimized count value of the target physical page is not an integer multiple of the standby optimized weight value (i.e., 4) of the lower physical page (the other one of the standby physical pages). That is to say, in this example, since the integer multiple of the standby optimized weight value of the middle physical page is the target optimized count value, the standby optimized weight value of the middle physical page is regarded as the target standby optimized weight value, and the read voltage optimization circuit 2152 identifies the middle physical page (i.e., the standby physical page corresponding to the target standby optimized weight value) as the target standby physical page.

Next, in step S313, the read voltage optimization circuit 2152 determines whether the total number of the plurality of standby physical pages is equal to the total number of the one or more target standby physical pages. Briefly, the read voltage optimization circuit 2152 determines whether all of the standby physical pages are the target standby physical pages.

In response to determining that the total number of the plurality of standby physical pages is not equal to the total number of the one or more target standby physical pages (step S313→No), step S314 is performed; in response to determining that the total number of the plurality of standby physical pages is equal to the total number of the one or more target standby physical pages (step S313→Yes), and step S316 is performed.

In step S314, the optimization count circuit 2151 changes the value of one or more optimized count values corresponding to the one or more target standby physical pages into the value of the target optimized count value. Next, in step S315, the read voltage optimization circuit 2152 performs the second type read voltage optimization operation to all the transition read voltages respectively belonging to the target physical page and the one or more target standby physical pages.

For example, it is assumed that the target physical page is a middle physical page, and the standby physical page is an upper physical page and a lower physical page, and the corresponding standby optimized weight values are 1 and 4 respectively. Further, it is assumed that the optimized count value (target optimized count value) of the updated middle physical page is 2 (e.g., the middle physical page is, for example, at the time point T2).

In this example, since the integer multiple (2 times) of the standby optimized weight value (i.e., 1) of the upper physical page is the target optimized count value (i.e., 2), the standby optimized weight value of the upper physical page is regarded as the target standby optimized weight value (step S310→Yes), and the read voltage optimization circuit 2152 identifies the upper physical page (i.e., the standby physical page corresponding to the target standby optimized weight value) as the target standby physical page (step S312). On the other hand, the target optimized count value of the target physical page is not an integer multiple of the standby optimized weight value (i.e., 4) of the lower physical page, the standby optimized weight value of the lower physical page is not regarded as the target standby optimized weight value, and the lower physical page is not identified as the target standby physical page.

On this occasion, the read voltage optimization circuit 2152 determines that the total number (i.e., 2) of the plurality of standby physical pages is not equal to the total number (i.e., 1) of the one or more target standby physical pages (step S313→No). The optimization count circuit 2151 first changes the value of the optimized count value corresponding to the upper physical page into the value of the target optimized count value, that is, the optimized count value of the upper physical page is set as 2 (step S314). Then, the read voltage optimization circuit 2152 performs the second type read voltage optimization operation to all the transition read voltages respectively belonging to the middle physical page (the target physical page) and the upper physical page (the target standby physical page).

Specifically, the second type read voltage optimization operation includes: performing the page level read voltage optimization operation to the target physical page and one or more standby physical pages of the plurality of physical pages, wherein the one or more standby physical pages are one or more other physical pages other than the target physical page in the plurality of physical pages, and the total number of the target physical page and the one or more standby physical pages is smaller than the total number of the plurality of physical pages.

For example, the read voltage optimization circuit 2152 first performs the page level read voltage optimization operation to the transition read voltages $V(1)_2$, $V(1)_6$ of the middle physical page according to the arrangement sequence of the physical pages, and then performs the page level read voltage optimization operation to the transition read voltages $V(1)_1$, $V(1)_3$, $V(1)_5$, $V(1)_7$ of the upper physical page.

On the other hand, in response to determining that the total number of the plurality of standby physical pages is equal to the total number of the one or more target standby physical pages (step S313→Yes), the process flow proceeds to step S316, the read voltage optimization circuit 2152 performs the third type read voltage optimization operation to all the transition read voltages respectively belonging to all of the physical pages of the target wordline.

For example, it is assumed the target physical page is a lower physical page, and the standby physical page is a middle physical page and an upper physical page, and the corresponding standby optimized weight values are 2 and 1 respectively. Further, it is assumed that the optimized count value (target optimized count value) of the updated lower physical page is 4 (e.g., the lower physical page is, for example, at the time point T4).

In this example, since the integer multiple (2 times) of the standby optimized weight value (i.e., 2) of the middle physical page is the target optimized count value (i.e., 4), the standby optimized weight value of the middle physical page is regarded as the target standby optimized weight value (step S310→Yes), and the read voltage optimization circuit 2152 identifies the middle physical page (i.e., the standby physical page corresponding to the target standby optimized weight value) as the target standby physical page (step S312). On the other hand, since the integer multiple (4 times) of the standby optimized weight value (i.e., 1) of the upper physical page is the target optimized count value (i.e., 4), the standby optimized weight value of the upper physical page is regarded as the target standby optimized weight value (step S310→Yes), and read voltage optimization circuit 2152 identifies the upper physical page (i.e., the standby physical page corresponding to the target standby optimized weight value) as the target standby physical page as well (step S312).

In this example, since all of the standby physical pages are identified as the target standby physical pages, the read voltage optimization circuit 2152 determines that the total number (i.e., 2) of the plurality of standby physical pages is equal to the total number (i.e., 2) of the plurality of target standby physical pages (step S313→Yes).

Next, the read voltage optimization circuit 2152 performs the third type read voltage optimization operation to all of the transition read voltages respectively belonging to all of the physical pages of the target wordline.

Specifically, the third type read voltage optimization operation includes: performing a wordline level read voltage optimization operation to the target wordline, wherein in the wordline level read voltage optimization operation performed to the target wordline, the voltage value of the plurality of preset read voltages of the preset read voltage set corresponding to the target wordline is adjusted to the optimized value, thereby obtaining the optimized read voltage set corresponding to the target wordline; or the page level read voltage optimization operation is performed to the plurality of physical pages respectively according to the arrangement sequence (lower physical page→middle physical page→upper physical page) of the plurality of physical pages.

For example, the read voltage optimization circuit 2152 may directly perform a wordline level read voltage optimization operation to the target wordline to simultaneously adjust the voltage value of all the read voltages $V(1)_1 \sim V(1)_7$ of the preset read voltage set of the target wordline to the optimized value, thereby obtaining the optimized read voltage set. Alternatively, the read voltage optimization circuit 2152 may first perform the page level read voltage optimization operation to the transition read voltage $V(1)_4$ of the lower physical page, perform the page level read voltage optimization operation to the transition read voltages $V(1)_2$ and $V(1)_6$ of the middle physical page, and then perform the page level read voltage optimization operation to the transition read voltages $V(1)_1$, $V(1)_3$, $V(1)_5$, $V(1)_7$ of the upper physical page. Then, the obtained optimized read voltage $V(X)_4$ corresponding to the lower physical page, the optimized read voltages $V(X)_2$ and $V(X)_6$ corresponding to the middle physical page, and the optimized read voltages $V(X)_1$, $V(X)_3$, $V(X)_5$, $V(X)_7$ corresponding to the upper physical page constitute the optimized read voltage set of the target wordline.

Next, in step S317, the optimization count circuit 2151 resets the plurality of optimized count values of the plurality of physical pages corresponding to the target wordline to zero after the third type read voltage optimization operation is completed.

Specifically, since all the physical pages of the target wordline have been subjected to the read voltage optimization operation, it may be regarded as that all the physical pages of the target wordline start to be accessed again from the time point T0. Based on this, the optimized count circuit 2151 can directly reset the plurality of optimized count values of the plurality of physical pages of the target wordline to zero.

In an embodiment, step S317 may also be omitted, but the optimization count circuit 2151 sets (changes) the optimized count value of all the target standby physical pages to the updated target optimized count value of the current target physical page.

Figure 3B:
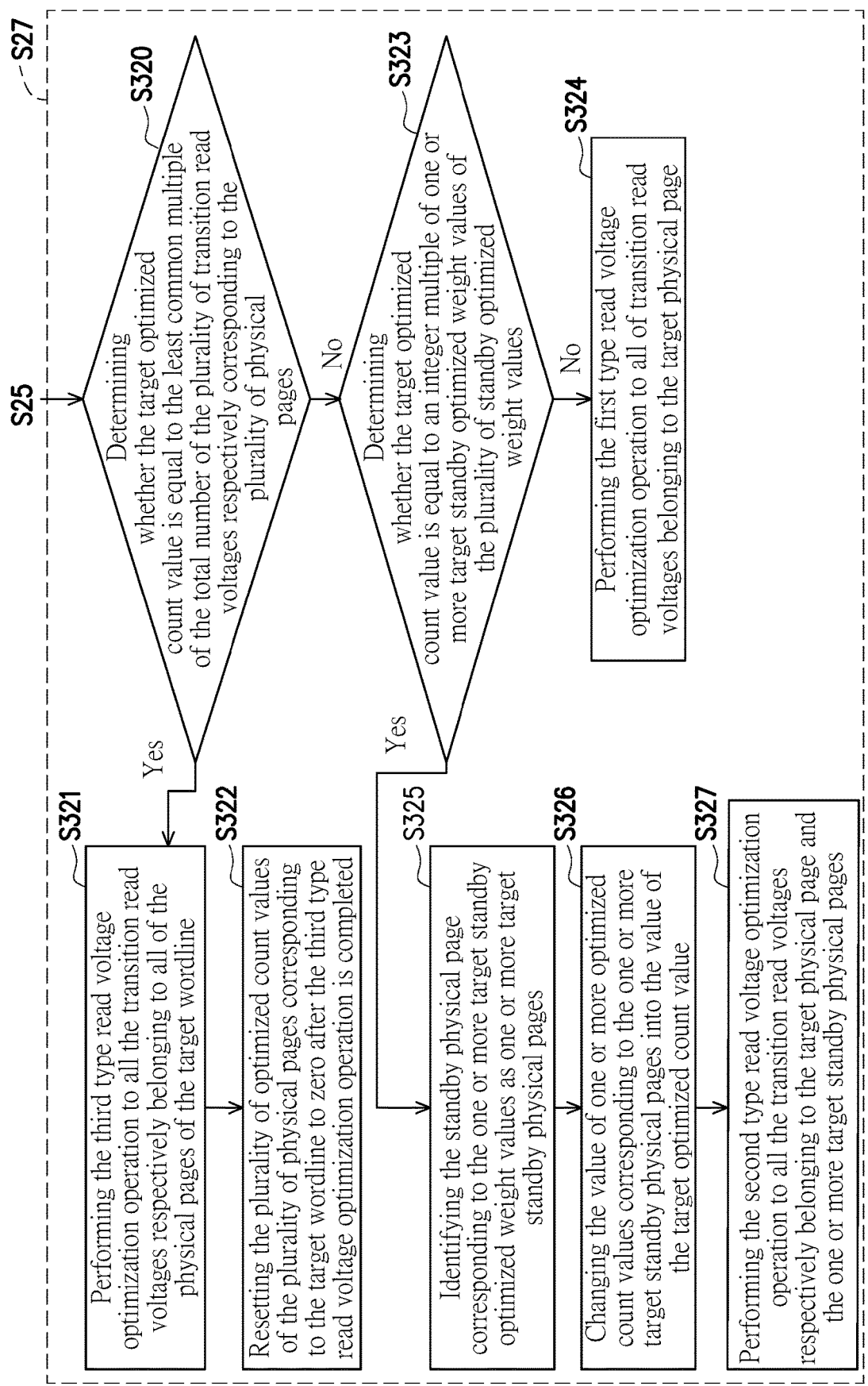
FIG. 3B is a flowchart of step S27 in FIG. 2 according to another embodiment of the disclosure.

FIG. 3B is a flowchart of step S27 in FIG. 2 according to another embodiment of the disclosure. The main difference between FIG. 3B and FIG. 3A is step S320. Further, steps S326 and S327 are the same as steps S314 and S315; steps S321 and S322 are the same as steps S316 and S317; step S324 is the same as step S311; and step S325 is the same as step S312.

Referring to FIG. 3B, in another embodiment, step S320 is performed first, and the read voltage optimization circuit 2152 can determine whether the target optimized count value is equal to the least common multiple of the total number of the plurality of transition read voltages respectively corresponding to the plurality of physical pages. In response to determining that the target optimized count value is equal to the least common multiple of the total number of the plurality of transition read voltages respectively corresponding to the plurality of physical pages (step S320→Yes), step S321 is performed.

Specifically, FIG. 3B utilizes the concept that "when the target optimized count value is equal to the least common multiple of the total number of the plurality of transition read voltages of the plurality of physical pages of the target wordline, the target physical page and all other standby physical pages should also be subjected to the read voltage optimization operation."

For example, referring to FIG. 5B, it is assumed that the target physical page is a lower physical page. At time point T6, the target optimized count value is updated to 6, and the target optimized count value is equal to the least common multiple "6" of the total number of the plurality of transition read voltages. On this occasion, according to the example of FIG. 5B, other standby physical pages should also reach a read voltage optimization cycle. For example, at the time point T6, the upper physical page has passed another read voltage optimization cycle $TP_U$ (the time length of 3 unit optimization period) from the read voltage optimization operation (time point T3) performed last time, and the read voltage optimization circuit 2152 determines that the page level read voltage optimization operation needs to be performed to the upper physical page. Additionally, the middle physical page has passed another read voltage optimization cycle $TP_M$ (the time length of 2 unit optimization period) from the read voltage optimization operation (time point T4) performed last time, and the read voltage optimization circuit 2152 determines that the page level read voltage optimization operation needs to be performed to the middle physical page.

That is, regardless of which physical page the target physical page is, at time point T6, as long as the updated target optimized count value is equal to the least common multiple of the total number of the plurality of transition read voltages, all the physical pages of the target wordline should be subjected to the third type read voltage optimization operation. The page level read voltage optimization operation is performed to all the physical pages of the target wordline according to the arrangement sequence of the physical pages, or the wordline level read voltage optimization operation is performed to the target wordline. As described above, the subsequent steps S321 and S322 are the same as steps S316 and S317 in FIG. 3A, and are not repeated herein.

Further, in response to determining that the target optimized count value is not equal to the least common multiple of the total number of the plurality of transition read voltages respectively corresponding to the plurality of physical pages (step S320→No), step S323 is performed.

Specifically, if not equal to the least common multiple, the read voltage optimization circuit 2152 can identify that the first type read voltage optimization operation or the second type read voltage optimization operation are likely to be performed at present time. The read voltage optimization circuit 2152 can make the judgment through step S323. In step S323, the read voltage optimization circuit 2152 determines whether the target optimized count value is equal to an integer multiple of one or more target standby optimized weight values of the plurality of standby optimized weight values.

If the determining result in the step S323 is "Yes", the read voltage optimization circuit 2152 identifies that there is a target standby physical page, and the second type read voltage optimization operation should be performed. As described above, the subsequent steps S325, S326, and S327 are the same as steps S312, S314, and S315 in FIG. 3A, and are not repeated herein.

If the determining result in the step S323 is "No", the read voltage optimization circuit 2152 identifies that there is no target standby physical page, and the page level read voltage optimization operation needs to be performed only to the target physical page, that is, the first type read voltage optimization operation should be performed. As described above, the subsequent step S324 is the same as the step S311 in FIG. 3A, and will not be repeated herein.

Returning to FIG. 2A, after completing step S27 and obtaining an optimized read voltage set of the target wordline, the target wordline can be read by using the optimized read voltage set, and the process flow may return to step S21.

In this embodiment, the concept that the optimized read voltage should be at the boundary of two threshold voltage distributions corresponding to two Gray Codes is adopted, and the concept that the area change at the boundary is smaller is adopted to seek the position of the optimized voltage. Persons having ordinary skill in the art should be able to improve the method/operation of optimizing read voltage described in the above embodiments based on the above concepts without departing from the spirit and scope of the disclosure.

In addition, as compared with the conventional method, the read voltage optimization method provided by the embodiment can further optimize one or more transition read voltages for the specific target physical page without adjusting the plurality of transition read voltages of other non-designated physical pages. In this way, since the disclosure focuses on the adjustment/test of one or more transition read voltages of the target physical page, it is possible to significantly reduce the total number of read operations performed for the read voltage optimization operation (because it is not necessary to adjust/test the transition read voltages of other non-designated physical pages).

For example, referring to FIG. 4B, as compared with the conventional method, at the time points T1, T2, T3, and T4, the conventional method may perform the wordline level read voltage optimization operation to the entire wordline because the reading status of the upper physical page is poor (e.g., reaching the read voltage optimization cycle), so that all the physical pages are subjected to the read voltage optimization operation, which causes the storage controller 210 to consume resource and time (e.g., the read counts on other physical pages that need not be subjected to the read voltage optimization operation is increased correspondingly) in processing other physical pages that need not be subjected to the read voltage optimization operation (because of not reaching the corresponding read voltage optimization cycle). That is to say, the data reading method provided by the disclosure can effectively determine whether to perform the first type, the second type or the third type read voltage optimization operation at the current time when one target physical page needs to be subjected to the read voltage optimization, thereby avoiding waste of resource and time (reducing unnecessary read counts), and thus increasing the data reading efficiency of the overall storage device. Specifically, as shown in FIG. 4B, the unnecessary read counts for the physical page (upper physical page) that is mostly likely to have poor reading status can be reduced.

In this embodiment, the page level read voltage optimization operation means performing an optimization operation to all the preset transition read voltages of a single physical page to obtain a corresponding optimized value (for example, obtaining the optimized value of the preset transition read voltage $V(1)_4$ of the lower physical page). The disclosure provides no limitation to the specific details of the "page level read voltage operation". For example, the corresponding optimized value may be found by using a plurality of read voltage optimization options corresponding to the target physical page; or the voltage value of the transition read voltage is adjusted and the adjusted transition read voltage is used to read the target physical page so as to determine whether the voltage value of the adjusted transition read voltage is the optimized value according to the obtained data reading result.

In addition, the wordline level read voltage optimization operation means performing an optimization operation to all the preset transition read voltages (i.e., to the entire preset read voltage set) of a single wordline to obtain the corresponding optimized value (e.g., obtaining the optimized read voltage set of the target wordline). The disclosure provides no limitation to the specific details of the "wordline level read voltage operation". For example, the corresponding optimized value may be found by using a plurality of read voltage optimization options corresponding to each wordline; or the transition read voltage set is adjusted and the adjusted transition read voltage set is used to read the target wordline so as to determine whether the adjusted transition read voltage set is the optimized read voltage set according to the obtained data reading result.

It should be noted that, in the above various embodiments, the read voltage management circuit unit 215 is implemented in the form of hardware circuit, but the disclosure is not limited thereto. For example, in an embodiment, the read voltage management circuit unit 215 may be implemented in the form of software or hardware as a read voltage management program code module having the function of the read voltage management circuit unit 215. The read voltage management program code module may include an optimization count program code module and a read voltage optimization program code module. The optimization count program code module is a program code module having the function of the optimization count circuit 2151; the read voltage optimization program code module is a program code module having the function of the read voltage optimization circuit 2152. The processor 211 can access and execute the read voltage management program code module (or the optimization count program code module and the read voltage optimization program code module) to implement the read voltage optimization method provided by the disclosure.

In summary, the data reading method, the storage controller, and the storage device provided by the embodiments of the disclosure are capable of updating target optimized count value corresponding to the target physical page in response to determining that the read voltage optimization operation needs to be performed to one target physical page of the plurality of physical pages of the target wordline, and determining whether to perform the read voltage optimization operation to other physical pages or the entire target wordline according to the target optimized count value; and using the obtained optimized read voltage set corresponding to the target wordline to read the target wordline after the read voltage optimization operation is completed. In this way, the correctness of the data read from the target wordline can be improved, and the overall efficiency of the data reading operation of the storage device can be enhanced.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A data reading method, adapted for a storage device configured with a rewritable non-volatile memory module, wherein the rewritable non-volatile memory module has a plurality of wordlines, wherein each of the plurality of wordlines is coupled to a plurality of memory cells, wherein each of the plurality of memory cells comprises a plurality of corresponding physical pages, and each of the plurality of physical pages is configured to be programmed into a bit value, the method comprising:

selecting one of the plurality of wordlines as a target wordline, and monitoring a plurality of physical pages of the selected target wordline to obtain a plurality of monitoring results respectively corresponding to the plurality of physical pages of the target wordline;

updating a target optimized count value corresponding to the target physical page in response to determining that a read voltage optimization operation needs to be performed to a target physical page of the plurality of physical pages of the target wordline according to the plurality of monitoring results; and performing a first type read voltage optimization operation, a second type read voltage optimization operation or a third type read voltage optimization operation corresponding to the target wordline according to the target optimized count value to obtain an optimized read voltage set corresponding to the target wordline, wherein the target wordline is read by using the optimized read voltage set.

2. The data reading method according to claim 1, wherein the data reading method further comprises:

when the plurality of monitoring results are a plurality of syndromes respectively corresponding to the plurality of physical pages, determining whether a total number of a first bit value belonging to each of the plurality of syndromes is greater than a syndrome threshold, wherein in response to determining that the total number of the first bit value belonging to a target syndrome of the plurality of syndromes is greater than the syndrome threshold, identifying the target physical page corresponding to the target syndrome, and determining that the read voltage optimization operation needs to be performed to the target physical page; and when the plurality of monitoring results are a plurality of error bit numbers respectively corresponding to the plurality of physical pages, determining whether the plurality of error bit numbers is greater than an error bit number threshold, wherein in response to determining that a target error bit number of the plurality of error bit numbers is greater than the error bit number threshold, identifying the target physical page corresponding to the target error bit number, and determining that the read voltage optimization operation needs to be performed to the target physical page.

3. The data reading method according to claim 1, wherein the step of updating the target optimized count value corresponding to the target physical page comprises:

identifying a total number of a plurality of transition read voltages respectively corresponding to the plurality of physical pages;

calculating a least common multiple of the total number of the plurality of transition read voltages;

using a quotient obtained by dividing the least common multiple by the total number of the plurality of transition read voltages respectively as a plurality of optimized weight values respectively corresponding to the plurality of physical pages;

identifying an optimized weight value of the plurality of optimized weight values corresponding to the target physical page as a target optimized weight value, and identifying a plurality of optimized weight values of the plurality of optimized weight values respectively corresponding to a plurality of standby physical pages as a plurality of standby optimized weight values, wherein the plurality of standby physical pages are a plurality of other unselected physical pages among the plurality of physical pages; and adding the target optimized weight value to an optimized count value corresponding to the target physical page to obtain the target optimized count value.

4. The data reading method according to claim 3, wherein the step of performing the first type read voltage optimization operation, the second type read voltage optimization operation or the third type read voltage optimization operation corresponding to the target wordline according to the target optimization count value comprises:

determining whether the target optimized count value is equal to an integer multiple of one or more target standby optimized weight values of the plurality of standby optimized weight values, wherein in response to determining that the target optimized count value is not equal to the integer multiple of any one of the plurality of optimized weight values respectively corresponding to a plurality of standby physical pages, performing the first type read voltage optimization operation to all of transition read voltages belonging to the target physical page, wherein in response to determining that the target optimized count value is equal to the integer multiple of the one or more target standby optimized weight values of the plurality of standby optimized weight values, identifying a standby physical page corresponding to the one or more targets standby optimized weight values as one or more target standby physical pages, and determining whether a total number of the plurality of standby physical pages is equal to a total number of the one or more target standby physical pages, wherein in response to determining that the total number of the plurality of standby physical pages is not equal to the total number of the one or more target standby physical pages, changing a value of one or more optimized count values corresponding to the one or more target standby physical pages into a value of the target optimized count value, and performing the second type read voltage optimization operation to all of transition read voltages respectively belonging to the target physical page and the one or more target standby physical pages, wherein in response to determining that the total number of the plurality of standby physical pages is equal to the total number of the one or more target standby physical pages, performing the third type read voltage optimization operation to all of transition read voltages respectively belonging to all physical pages of the target wordline, after completing the third type read voltage optimization operation, resetting a plurality of optimized count values respectively corresponding to the plurality of physical pages of the target wordline to zero.

5. The data reading method according to claim 3, wherein the step of performing the first type read voltage optimization operation, the second type read voltage optimization operation or the third type read voltage optimization operation corresponding to the target wordline according to the target optimized count value comprises:

determining whether the target optimized count value is equal to a least common multiple of a total number of a plurality of transition read voltages respectively corresponding to the plurality of physical pages, wherein in response to determining that the target optimized count value is equal to the least common multiple, performing the third type read voltage optimization operation to all transition read voltages respectively belonging to all physical pages of the target wordline, and after completing the third type read voltage optimization operation, resetting a plurality of optimized count values respectively corresponding to the plurality of physical pages of the target wordline to zero, wherein in response to determining that the target optimized count value is not equal to the least common multiple, determining whether the target optimized count value is equal to an integer multiple of one or more target standby optimized weight values of the plurality of standby optimized weight values, wherein in response determining that the target optimized count value is not equal to an integer multiple of any one of the plurality of optimized weight values respectively corresponding to a plurality of standby physical pages, performing the first type read voltage optimization operation to all transition read voltages belonging to the target physical page, wherein in response determining that the target optimized count value is equal to an integer multiple of the one or more target standby optimized weight values of the plurality of optimized weight values, identifying a standby physical page corresponding to the one or more target standby optimized weight values as one or more target standby physical pages, changing a value of one or more optimized count values corresponding to the one or more target standby physical pages into a value of the target optimized count value, and performing the second type read voltage optimization operation to all transition read voltages respectively belonging to the target physical page and the one or more target standby physical pages.

6. The data reading method according to claim 1, wherein the first type read voltage optimization operation comprises:

performing a page level read voltage optimization operation only to the target physical page, wherein in the page level read voltage optimization operation performed to the target physical page, adjusting a voltage value of one or more transition read voltages for identifying a storage state of the target physical page among a plurality of preset read voltages of a preset read voltage set corresponding to the target wordline to an optimized value to obtain the optimized read voltage set corresponding to the target wordline, wherein the second type read voltage optimization operation comprises:

performing the page level read voltage optimization operation to the target physical page and one or more standby physical pages of the plurality of physical pages, wherein the one or more standby physical pages are one or more other physical pages other than the target physical page in the plurality of physical pages, and a total number of the target physical page and the one or more standby physical pages is less than a total number of the plurality of physical pages, wherein the third type read voltage optimization operation comprises:

performing a wordline level read voltage optimization operation to the target wordline, wherein in the wordline level read voltage optimization operation performed to the target wordline, adjusting a voltage value of the plurality of preset read voltages of the preset read voltage set corresponding to the target wordline to an optimized value to obtain the optimized read voltage set corresponding to the target wordline; or performing the page level read voltage optimization operation respectively to the plurality of physical pages according to an arrangement sequence of the plurality of physical pages.

7. A storage controller for controlling a storage device configured with a rewritable non-volatile memory module, the storage controller comprising:

a connection interface circuit, coupled to a host system;

a memory interface control circuit, coupled to the rewritable non-volatile memory module;

wherein the rewritable non-volatile memory module has a plurality of wordlines, wherein each of the plurality of wordlines is coupled to a plurality of memory cells, wherein each of the plurality of memory cells comprises a plurality of physical pages, and each of the plurality of physical pages is configured to be programmed into a bit value;

a read voltage management circuit unit; and a processor, coupled to the connection interface circuit, the memory interface control circuit and the read voltage management circuit unit, wherein the processor is configured to select one of the plurality of wordlines as a target wordline, and monitor a plurality of physical pages of the selected target wordline to obtain a plurality of monitoring results respectively corresponding to the plurality of physical pages of the target wordline, wherein the read voltage management circuit unit is further configured to perform a first type read voltage optimization operation, a second type read voltage optimization operation or a third type read voltage optimization operation corresponding to the target wordline according to the target optimized count value to obtain an optimized read voltage set corresponding to the target wordline, wherein the target wordline is read by using the optimized read voltage set.

8. The storage controller according to claim 7, wherein:

when the plurality of monitoring results are a plurality of syndromes respectively corresponding to the plurality of physical pages, the processor determines whether a total number of a first bit value respectively belonging to each of the plurality of syndromes is greater than a syndrome threshold, wherein in response to determining that a total number of the first bit value belonging to a target syndrome of the plurality of syndromes is greater than the syndrome threshold, the processor identifies the target physical page corresponding to the target syndrome, and determines that the read voltage optimization operation needs to be performed to the target physical page, wherein when the plurality of monitoring results are a plurality of error bit numbers respectively corresponding to the plurality of physical pages, the processor determines whether the plurality of error bit numbers is greater than an error bit number threshold, wherein in response to determining that a target error bit number in the plurality of error bit numbers is greater than the error bit number threshold, the processor identifies the target physical page corresponding to the target error bit number, and determines that the read voltage optimization operation needs to be performed to the target physical page.

9. The storage controller according to claim 7, wherein in the operation that the read voltage management circuit unit is configured to update the target optimized count value corresponding to the target physical page, the read voltage management circuit unit identifies a total number of a plurality of transition read voltages respectively corresponding to the plurality of physical pages, wherein the read voltage management circuit unit calculates a least common multiple of a total number of the plurality of transition read voltages, wherein the read voltage management circuit unit uses a quotient obtained by dividing the least common multiple by the total number of the plurality of transition read voltages respectively as a plurality of optimized weight values respectively corresponding to the plurality of physical pages, wherein the read voltage management circuit unit identifies an optimized weight value of the plurality of optimized weight values corresponding to the target physical page as a target optimized weight value, and identifies a plurality of optimized weight values of the plurality of optimized weight values respectively corresponding to a plurality of standby physical pages as a plurality of standby optimized weight values, wherein the plurality of standby physical pages are a plurality of other unselected physical pages among the plurality of physical pages, wherein the read voltage management circuit unit adds the target optimized weight value to an optimized count value corresponding to the target physical page to obtain the target optimized count value.

10. The storage controller according to claim 9, wherein in the operation that the read voltage management circuit unit is further configured to perform the first type read voltage optimization operation, the second type read voltage optimization operation or the third type read voltage optimization operation corresponding to the target wordline according to the target optimized count value, the read voltage management circuit unit determines whether the target optimized count value is equal to an integral multiple of one or more target standby optimized weight values of the plurality of standby optimized weight values, wherein in response to determining that the target optimized count value is not equal to an integer multiple of any one of the plurality of optimized weight values respectively corresponding to a plurality of standby physical pages, the read voltage management circuit unit performs the first type read voltage optimization operation to all of transition read voltages belonging to the target physical page, wherein in response to determining that the target optimized count value is equal to an integer multiple of the one or more target standby optimized weight values of the plurality of standby optimized weight values, the read voltage management circuit unit identifies a standby physical page corresponding to the one or more target standby optimized weight values as one or more target standby physical pages, and the read voltage management circuit unit determines whether a total number of the plurality of standby physical pages is equal to a total number of the one or more target standby physical pages, wherein in response to determining that the total number of the plurality of standby physical pages is not equal to the total number of the one or more target standby physical pages, the read voltage management circuit unit changes a value of one or more optimized count values corresponding to the one or more target standby physical pages into a value of the target optimized count value, and performs the second type read voltage optimization operation to all of transition read voltages respectively belonging to the target physical page and the one or more target standby physical pages, wherein in response to determining that the total number of the plurality of standby physical pages is equal to the total number of the one or more target standby physical pages, the read voltage management circuit unit performs the third type read voltage optimization operation to all of transition read voltages respectively belonging to all of physical pages of the target wordline, and after the third type read voltage optimization operation is completed, a plurality of optimized count values respectively corresponding to the plurality of physical pages of the wordline are reset to zero.

11. The storage controller according to claim 9, wherein in the operation that the read voltage management circuit unit is further configured to perform the first type read voltage optimization operation, the second type read voltage optimization operation or the third type read voltage optimization operation corresponding to the target wordline according to the target optimized count value, the read voltage management circuit unit determines whether the target optimized count value is equal to a least common multiple of a plurality of transition read voltages respectively corresponding to the plurality of physical pages, wherein in response to determining that the target optimized count value is equal to the least common multiple, the read voltage management circuit unit performs the third type read voltage optimization operation to all of transition read voltages respectively belonging to all physical pages of the target wordline, and after the third type read voltage optimization operation is completed, a plurality of optimized count values respectively corresponding to the plurality of physical pages of the target wordline are reset to zero, wherein in response to determining that the target optimized count value is not equal to the least common multiple, the read voltage management circuit unit determines whether the target optimized count value is equal to an integer multiple of one or more target standby optimized weight values of the plurality of standby optimized weight values, wherein in response to determining that the target optimized count value is not equal to an integer multiple of any one of the plurality of optimized weight values respectively corresponding to a plurality of standby physical pages, the read voltage management circuit unit performs the first type read voltage optimization operation to all of transition read voltages belonging to the target physical page, wherein in response to determining that the target optimized count value is equal to an integer multiple of the one or more target standby optimized weight values of the plurality of standby optimized weight values, the read voltage management circuit unit identifies a standby physical page corresponding to the one or more target standby optimized weight values as one or more target standby physical pages, changes a value of one or more optimized count values corresponding to one or more target standby physical pages to a value of the target optimized count value, and performs the second type read voltage optimization operation to all of transition read voltages respectively belonging to the target physical page and the one or more target standby physical pages.

12. The storage controller according to claim 7, wherein the first type read voltage optimization operation comprises:

the read voltage management circuit unit performs a page level read voltage optimization operation only to the target physical page, wherein in the page level read voltage optimization operation performed to the target physical page, the read voltage management circuit unit adjusts a voltage value of one or more transition read voltages for identifying a storage state of the target physical page of a plurality of preset read voltages among a preset read voltage set corresponding to the target wordline to an optimized value to obtain the optimized read voltage set corresponding to the target wordline, wherein the second type read voltage optimization operation comprises:

the read voltage management circuit unit performs the page level read voltage optimization operation to the target physical page and one or more standby physical pages of the plurality of physical pages, wherein the one or more standby physical pages are one or more other physical pages other than the target physical page in the plurality of physical pages, and a total number of the target physical page and the one or more standby physical pages is less than a total number of the plurality of physical pages, wherein the third type read voltage optimization operation comprises:

the read voltage management circuit unit performs a wordline level read voltage optimization operation to the target wordline, wherein in the wordline level read voltage optimization operation performed to the target wordline, the read voltage management circuit unit adjusts a voltage value of the plurality of preset read voltages of the preset read voltage set corresponding to the target wordline to an optimized value to obtain the optimized read voltage set corresponding to the target wordline; or the read voltage management circuit unit performs the page level read voltage optimization operation respectively to the plurality of physical pages according to an arrangement sequence of the plurality of physical pages.

13. A storage device, the storage device comprising:

a rewritable non-volatile memory module, wherein the rewritable non-volatile memory module has a plurality of wordlines, wherein each of the plurality of wordlines is coupled to a plurality of memory cells, wherein each of the plurality of memory cells comprises a plurality of physical pages, and each of the plurality of physical pages is configured to be programmed into a bit value;

a memory interface control circuit, configured to couple to the rewritable non-volatile memory module; and a processor, coupled to the memory interface control circuit, wherein the processor loads and executes a read voltage management program code module to implement a data reading method, the data reading method comprises the following steps:

selecting one of the plurality of wordlines as a target wordline, and monitoring a plurality of physical pages of the selected target wordline to obtain a plurality of monitoring results respectively corresponding to the plurality of physical pages of the target wordline;

updating a target optimized count value corresponding to the target physical page in response to determining that a read voltage optimization operation needs to be performed to a target physical page of the plurality of physical pages of the target wordline according to the plurality of monitoring results; and performing a first type read voltage optimization operation, a second type read voltage optimization operation or a third type read voltage optimization operation corresponding to the target wordline according to the target optimized count value to obtain an optimized read voltage set corresponding to the target wordline, wherein the target wordline is read by using the optimized read voltage set.

* * * * *